United States Patent
Noh et al.

(10) Patent No.: US 11,139,836 B2
(45) Date of Patent: Oct. 5, 2021

(54) INFORMATION TRANSMISSION METHOD AND TRANSMISSION DEVICE, AND INFORMATION RECEPTION METHOD AND RECEPTION DEVICE

(71) Applicants: LG Electronics Inc., Seoul (KR); Ajou University Industry-Academic Cooperation Foundation, Gyeonggi-do (KR)

(72) Inventors: Kwangseok Noh, Seoul (KR); Bonghoe Kim, Seoul (KR); Song Nam Hong, Gyeonggi-do (KR)

(73) Assignees: LG Electronics Inc., Seoul (KR); Ajou University Industry-Academic Cooperation Foundation, Gyeonggi-do (KR)

(*) Notice: Subject to any disclaimer, the term of this patent is extended or adjusted under 35 U.S.C. 154(b) by 0 days.

(21) Appl. No.: 16/637,481

(22) PCT Filed: Aug. 8, 2018

(86) PCT No.: PCT/KR2018/009025
§ 371 (c)(1),
(2) Date: Feb. 7, 2020

(87) PCT Pub. No.: WO2019/031841
PCT Pub. Date: Feb. 14, 2019

(65) Prior Publication Data
US 2020/0244288 A1 Jul. 30, 2020

Related U.S. Application Data

(60) Provisional application No. 62/547,159, filed on Aug. 18, 2017, provisional application No. 62/546,550, (Continued)

(51) Int. Cl.
H03M 13/27 (2006.01)
H03M 13/09 (2006.01)
H03M 13/13 (2006.01)
H04L 1/00 (2006.01)

(52) U.S. Cl.
CPC ....... *H03M 13/2792* (2013.01); *H03M 13/09* (2013.01); *H03M 13/13* (2013.01);
(Continued)

(58) Field of Classification Search
CPC ...... H03M 13/09; H03M 13/13; H03M 13/23; H03M 13/2792; H03M 13/27; H04L 1/0057; H04L 1/0061; H04L 1/0071
See application file for complete search history.

(56) References Cited

U.S. PATENT DOCUMENTS

| 9,960,889 B2* | 5/2018 | Kim ................. H03M 13/23 |
| 10,313,056 B2* | 6/2019 | Koike-Akino .... H03M 13/2792 |
| 10,320,422 B2* | 6/2019 | Shen .................. H04L 1/0061 |

FOREIGN PATENT DOCUMENTS

| KR | 101671257 | 11/2016 |
| WO | WO2012067443 | 5/2012 |
| WO | WO2015026148 | 2/2015 |

OTHER PUBLICATIONS

Akino et al., Bit Interleaved polar coded OFDM for low latency M2M Wireless communications, IEEE, pp. 1-7 (Year: 2017).*
(Continued)

*Primary Examiner* — Shelly A Chase
(74) *Attorney, Agent, or Firm* — Fish & Richardson P.C.

(57) ABSTRACT

In a wireless communication system, a transmission device generates (K+J) bits by adding J cyclic redundancy check (CRC) bits to K information bits, and interleaves the (K+J) bits according to a seed value-based interleaving pattern. The transmission device encodes the bits interleaved according to the interleaving pattern, using a polar code. The seed
(Continued)

value permutates the CRC bits, and a value previously determined according to K is used as the seed value.

19 Claims, 11 Drawing Sheets

Related U.S. Application Data filed on Aug. 16, 2017, provisional application No. 62/542,809, filed on Aug. 9, 2017, provisional application No. 62/542,286, filed on Aug. 8, 2017.

(52) U.S. Cl.
CPC .......... *H04L 1/0057* (2013.01); *H04L 1/0061* (2013.01); *H04L 1/0071* (2013.01)

(56) References Cited

OTHER PUBLICATIONS

Meng et al., A Novel interleaving scheme for polar codes, IEEE, pp. 1 to 5 (Year: 2016).*

Nokia, Alcatel-Lucent Shanghai Bell, "Design details of distributed CRC," R1-1708833, 3GPP TSG RAN WG1 Meeting #89, Hangzhou, P.R. China, dated May 15-19, 2017, 7 pages.

PCT International Search Report and Written Opinion in International Application No. PCT/KR2018/009025, dated Dec. 10, 2018, 23 pages (with English translation).

ZTE, "Performance evaluations on Polar codes with distributed CRC bits," R1-1707181, 3GPP TSG RAN WG1 Meeting #89, Hangzhou, China, dated May 15-19, 2017, 6 pages.

\* cited by examiner

☐ : systematic bit    ▦ : RV point
▨ : Parity 0         ▧ : Parity 1

$$F = \begin{bmatrix} 1 & 0 \\ 1 & 1 \end{bmatrix}$$

(a)                                    (b)

(a)

(b)

(a)

(b)

INFORMATION TRANSMISSION METHOD AND TRANSMISSION DEVICE, AND INFORMATION RECEPTION METHOD AND RECEPTION DEVICE

CROSS-REFERENCE TO RELATED APPLICATIONS

This application is a National Stage application under 35 U.S.C. § 371 of International Application No. PCT/KR2018/009025, filed on Aug. 8, 2018, which claims the benefit of U.S. Provisional Application No. 62/547,159, filed on Aug. 18, 2017, U.S. Provisional Application No. 62/546,550, filed on Aug. 16, 2017, U.S. Provisional Application No. 62/542,809, filed on Aug. 9, 2017, and U.S. Provisional Application No. 62/542,286, filed on Aug. 8, 2017. The disclosures of the prior applications are incorporated by reference in their entirety.

TECHNICAL FIELD

The present disclosure relates to a wireless communication system, and more particularly to, a method and device for receiving/transmitting a downlink signal.

BACKGROUND ART

With appearance and spread of machine-to-machine (M2M) communication, machine type communication (MTC) and a variety of devices such as smartphones and tablet Personal Computers (PCs) and technology demanding a large amount of data transmission, data throughput needed in a cellular network has rapidly increased. To satisfy such rapidly increasing data throughput, carrier aggregation technology, cognitive radio technology, etc. for efficiently employing more frequency bands and multiple input multiple output (MIMO) technology, multi-base station (BS) cooperation technology, etc. for raising data capacity transmitted on limited frequency resources have been developed.

As more communication devices have demanded higher communication capacity, there has been necessity of enhanced mobile broadband (eMBB) relative to legacy radio access technology (RAT). In addition, massive machine type communication (mMTC) for providing various services anytime and anywhere by connecting a plurality of devices and objects to each other is one main issue to be considered in future-generation communication.

Further, a communication system to be designed in consideration of services/UEs sensitive to reliability and latency is under discussion. The introduction of future-generation RAT has been discussed by taking into consideration eMBB communication, mMTC, ultra-reliable and low-latency communication (URLLC), and the like.

DISCLOSURE

Technical Problem

Due to introduction of new radio communication technology, the number of user equipments (UEs) to which a BS should provide a service in a prescribed resource region increases and the amount of data and control information that the BS should transmit to the UEs increases. Since the amount of resources available to the BS for communication with the UE(s) is limited, a new method in which the BS efficiently receives/transmits uplink/downlink data and/or uplink/downlink control information using the limited radio resources is needed. In other words, as the density of nodes and/or the density of UEs increases, a method of efficiently using high-density nodes or high-density UEs for communication is needed.

With development of technologies, overcoming delay or latency has become an important challenge. Applications whose performance critically depends on delay/latency are increasing. Accordingly, a method to reduce delay/latency compared to the legacy system is demanded.

In a new communication system, the use of polar codes has been considered to improve channel coding performance. Generally, the polar code is much greater than other codes used for channel coding. Thus, considering a case in which the polar code is used for channel coding, a method of improving the decoding speed of the polar code is required.

If a normal interleaver is applied to bits obtained using the polar code, latency may increase. Thus, an interleaver for improving the speed of decoding when the polar code is used is required.

The technical objects that can be achieved through the present disclosure are not limited to what has been particularly described hereinabove and other technical objects not described herein will be more clearly understood by persons skilled in the art from the following detailed description.

Technical Solution

In an aspect of the present disclosure, provided herein is a method of transmitting information by a transmitting device in a wireless communication system. The method may include: generating K+J bits by adding J cyclic redundancy check (CRC) bits to K information bits; interleaving the K+J bits according to an interleaving pattern based on a seed value for permuting the J CRC bits; encoding the interleaved bits based on a polar code; and transmitting the encoded bits to a receiving device. The seed value may be predetermined based on K.

In another aspect of the present disclosure, provided herein is a transmitting device for transmitting information in a wireless communication system. The transmitting device may include: a CRC encoder configured to generate K+J bits by adding J CRC bits to K information bits; an interleaver configured to interleave the K+J bits according to an interleaving pattern based on a seed value for permuting the J CRC bits; a polar encoder configured to encode the interleaved bits based on a polar code; and a transceiver configured to transmit the encoded bits to a receiving device. The seed value may be predetermined based on K.

In still another aspect of the present disclosure, provided herein is a method of receiving information by a receiving device in a wireless communication system. The method may include: receiving, from a transmitting device, K+J bits encoded based on a polar code, where K is the number of information bits and J is the number of CRC bits; and decoding the K+J bits based on the polar code according to an interleaving pattern. The interleaving pattern may be based on a seed value for permuting the J CRC bits, and the seed value may be predetermined based on K.

In a further aspect of the present disclosure, provided herein is a receiving device for receiving information in a wireless communication system. The receiving device may include: a transceiver configured to receive, from a transmitting device, K+J bits encoded based on a polar code, where K is the number of information bits and J is the number of CRC bits; and a polar decoder configured to decode the K+J bits based on the polar code according to an interleaving pattern. The interleaving pattern may be based on a seed value for permuting the J CRC bits, and the seed value may be predetermined based on K.

In each aspect of the present disclosure, when J=19 and a CRC generator polynomial for generation of the J CRC bits is $x^{19}+x^{18}+x^{16}+x^{15}+x^{14}+x^{13}+x^{12}+x^{10}+x^9+x^7+x^5+x^3+x^2+x+1$, a seed value for K+J=64 may be s=(5, 8, 4, 15, 7, 19, 18, 16, 6, 14, 10, 12, 13, 9, 11, 2, 1, 3, 17).

In each aspect of the present disclosure, an interleaving pattern for K+J=64 may be Int=(6, 7, 8, 10, 11, 16, 18, 19, 20, 23, 26, 27, 28, 30, 32, 36, 39, 40, 43, 45, 50, 1, 4, 13, 14, 24, 34, 37, 44, 53, 2, 9, 29, 42, 49, 5, 12, 15, 17, 21, 22, 25, 33, 38, 41, 60, 3, 35, 52, 31, 64, 63, 61, 51, 59, 55, 57, 58, 54, 56, 47, 46, 48, 62).

In each aspect of the present disclosure, an interleaving pattern for K+J=64 may be Int=(6, 7, 8, 10, 11, 16, 18, 19, 20, 23, 26, 27, 28, 30, 32, 36, 39, 40, 43, 45, 50, 1, 4, 13, 14, 24, 34, 37, 44, 53, 2, 9, 29, 42, 49, 5, 12, 15, 17, 21, 22, 25, 33, 38, 41, 60, 3, 35, 52, 31, 46, 47, 48, 51, 54, 55, 56, 57, 58, 59, 61, 62, 63, 64).

In each aspect of the present disclosure, an interleaving pattern for K+J=K' smaller than 64 may include values greater than 0 among values obtained by subtracting 64-K from each element of the interleaving pattern for K+J=64.

In each aspect of the present disclosure, when J=19 and a CRC generator polynomial for generation of the J CRC bits is $x^{19}+x^{18}+x^{16}+x^{15}+x^{14}+x^{13}+x^{12}+x^{10}+x^9+x^7+x^5+x^3+x^2+x+1$, a seed value for K+J=128 may be s=(11, 10, 1, 12, 13, 17, 19, 2, 6, 4, 14, 16, 5, 3, 15, 8, 18, 7, 9).

In each aspect of the present disclosure, when J=19 and a CRC generator polynomial for generation of the J CRC bits is $x^{19}+x^{18}+x^{16}+x^{15}+x^{14}+x^{13}+x^{12}+x^{10}+x^9+x^7+x^5+x^3+x^2+x+1$, a seed value for K+J=192 may be s=(3, 6, 1, 5, 8, 19, 10, 2, 15, 4, 12, 11, 9, 17, 16, 13, 14, 7, 18).

In each aspect of the present disclosure, when J=19 and a CRC generator polynomial for J CRC codes is $x^{19}+x^{18}+x^{16}+x^{15}+x^{14}+x^{13}+x^{12}+x^{10}+x^9+x^7+x^5+x^3+x^2+x+1$, a seed value for K+J=256 may be s=(6, 3, 11, 19, 9, 15, 12, 14, 8, 1, 10, 2, 17, 7, 13, 5, 18, 4, 16).

In each aspect of the present disclosure, when J=19 and a CRC generator polynomial for J CRC codes is $x^{19}+x^{18}+x^{16}+x^{15}+x^{14}+x^{13}+x^{12}+x^{10}+x^9+x^7+x^5+x^3+x^2+x+1$, a seed value for K+J=320 may be s=(3, 6, 11, 13, 2, 8, 18, 4, 1, 12, 5, 7, 14, 17, 10, 15, 16, 19, 9).

In each aspect of the present disclosure, when J=19 and a CRC generator polynomial for J CRC codes is $x^{19}+x^{18}+x^{16}+x^{15}+x^{14}+x^{13}+x^{12}+x^{10}+x^9+x^7+x^5+x^3+x^2+x+1$, a seed value for K+J=384 may be s=(6, 3, 11, 5, 1, 8, 2, 9, 17, 19, 15, 13, 14, 12, 18, 4, 10, 16, 7).

In each aspect of the present disclosure, when J=19 and a CRC generator polynomial for J CRC codes is $x^{19}+x^{18}+x^{16}+x^{15}+x^{14}+x^{13}+x^{12}+x^{10}+x^9+x^7+x^5+x^3+x^2+x+1$, a seed value for K+J=448 may be s=(6, 3, 18, 2, 1, 16, 10, 19, 8, 17, 9, 13, 5, 7, 4, 12, 14, 11, 15).

In each aspect of the present disclosure, when J=19 and a CRC generator polynomial for J CRC codes is $x^{19}+x^{18}+x^{16}+x^{15}+x^{14}+x^{13}+x^{12}+x^{10}+x^9+x^7+x^5+x^3+x^2+x+1$, a seed value for K+J=512 may be s=(3, 6, 11, 2, 5, 12, 16, 8, 10, 1, 13, 17, 9, 19, 18, 7, 14, 15, 4).

In each aspect of the present disclosure, when J=19 and a CRC generator polynomial for J CRC codes is $x^{19}+x^{18}+x^{15}+x^{15}+x^{14}+x^{13}+x^{12}+x^{10}+x^9+x^7+x^5+x^3+x^2+x+1$, a seed value for K+J=576 may be s=(6, 11, 9, 7, 10, 13, 16, 2, 8, 15, 4, 1, 3, 17, 19, 12, 5, 14, 18).

In each aspect of the present disclosure, when J=19 and a CRC generator polynomial for J CRC codes is $x^{19}+x^{18}+x^{16}+x^{15}+x^{14}+x^{13}+x^{12}+x^{10}+x^9+x^7+x^5+x^3+x^2+x+1$, a seed value for K+J=640 may be s=(1, 2, 19, 8, 18, 16, 17, 13, 4, 12, 3, 7, 9, 6, 10, 5, 15, 11, 14).

In each aspect of the present disclosure, when J=19 and a CRC generator polynomial for J CRC codes is $x^{19}+x^{18}+x^{16}+x^{15}+x^{14}+x^{13}+x^{12}+x^{10}+x^9+x^7+x^5+x^3+x^2+x+1$, a seed value for K+J=704 may be s=(19, 1, 18, 15, 16, 17, 6, 11, 2, 12, 9, 5, 7, 13, 4, 14, 10, 8, 3).

In each aspect of the present disclosure, when J=19 and a CRC generator polynomial for J CRC codes is $x^{19}+x^{18}+x^{16}+x^{15}+x^{14}+x^{13}+x^{12}+x^{10}+x^9+x^7+x^5+x^3+x^2+x+1$, a seed value for K+J=768 may be s=(2, 1, 3, 12, 5, 4, 18, 15, 7, 16, 14, 13, 17, 8, 6, 19, 10, 9, 11).

In each aspect of the present disclosure, when J=19 and a CRC generator polynomial for J CRC codes is $x^{19}+x^{18}+x^{16}+x^{15}+x^{14}+x^{13}+x^{12}+x^{10}+x^9+x^7+x^5+x^3+x^2+x+1$, a seed value for K+J>768 may be s=(1, 6, 9, 12, 13, 8, 10, 19, 14, 4, 16, 5, 3, 2, 15, 7, 11, 17, 18).

The above technical solutions are merely some parts of the examples of the present disclosure and various examples into which the technical features of the present disclosure are incorporated can be derived and understood by persons skilled in the art from the following detailed description of the present disclosure.

Advantageous Effects

According to example(s) of the present disclosure, uplink/downlink signals can be efficiently transmitted/received. Therefore, overall throughput of a radio communication system can be improved.

In addition, signals can be transmitted/received efficiently and at a low error rate in a wireless communication system.

According to the present disclosure, when a polar code is used for channel coding, the speed of decoding may be improved.

It will be appreciated by persons skilled in the art that that the effects that can be achieved through the present disclosure are not limited to what has been particularly described hereinabove and other advantages of the present disclosure will be more clearly understood from the following detailed description.

BRIEF DESCRIPTION OF THE DRAWINGS

The accompanying drawings, which are included to provide a further understanding of the disclosure, illustrate examples of the disclosure and together with the description serve to explain the principle of the disclosure.

MODE FOR CARRYING OUT THE INVENTION

Figure 1:
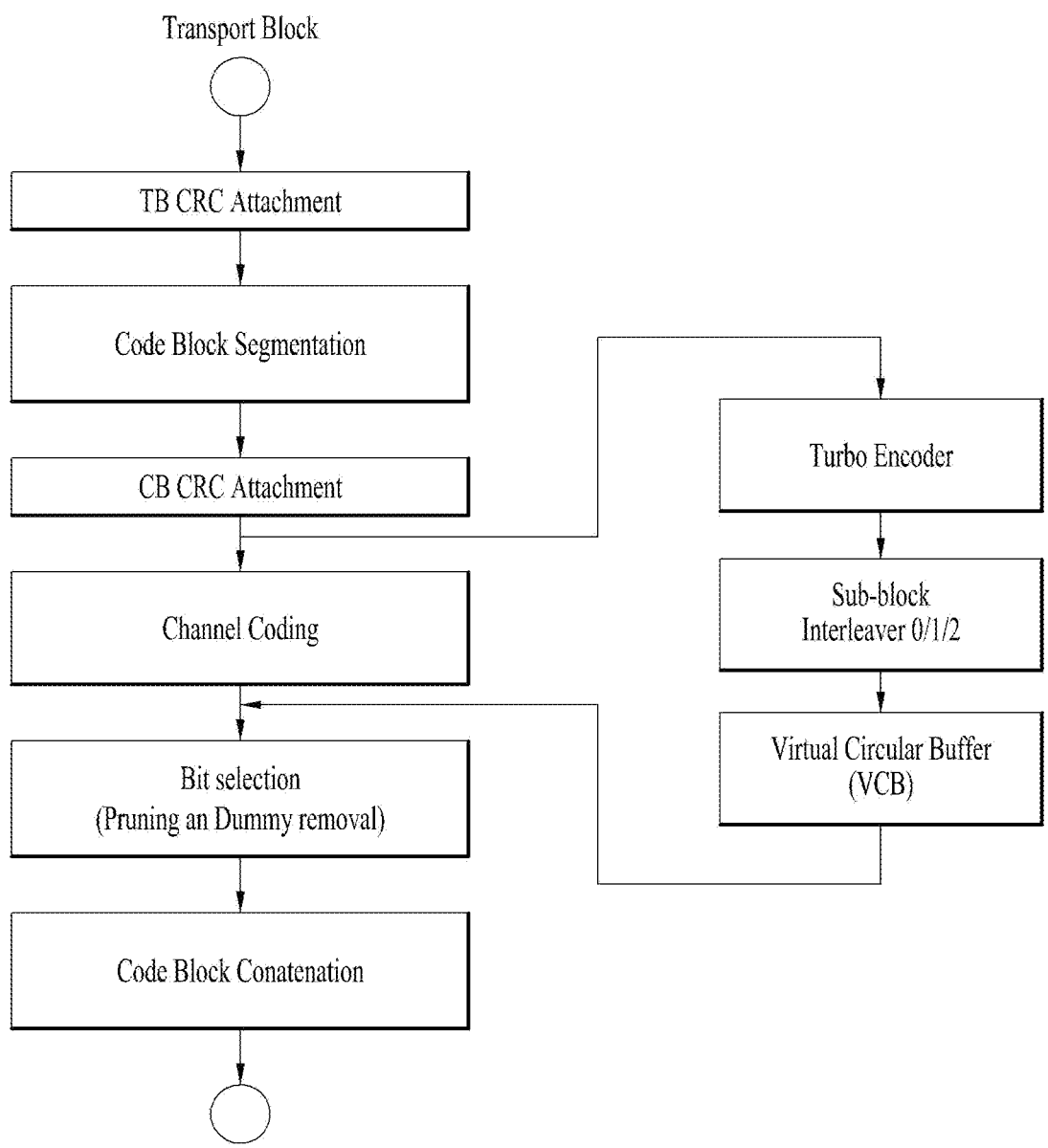
FIG. 1 illustrates a transport block processing procedure in an LTE/LTE-A system.

Reference will now be made in detail to the exemplary examples of the present disclosure, examples of which are illustrated in the accompanying drawings. The detailed description, which will be given below with reference to the accompanying drawings, is intended to explain exemplary examples of the present disclosure, rather than to show the only examples that can be implemented according to the disclosure. The following detailed description includes specific details in order to provide a thorough understanding of the present disclosure. However, it will be apparent to those skilled in the art that the present disclosure may be practiced without such specific details.

In some instances, known structures and devices are omitted or are shown in block diagram form, focusing on important features of the structures and devices, so as not to obscure the concept of the present disclosure. The same reference numbers will be used throughout this specification to refer to the same or like parts.

The following techniques, apparatuses, and systems may be applied to a variety of wireless multiple access systems. Examples of the multiple access systems include a code division multiple access (CDMA) system, a frequency division multiple access (FDMA) system, a time division multiple access (TDMA) system, an orthogonal frequency division multiple access (OFDMA) system, a single carrier frequency division multiple access (SC-FDMA) system, and a multicarrier frequency division multiple access (MC-FDMA) system. CDMA may be embodied through radio technology such as universal terrestrial radio access (UTRA) or CDMA2000. TDMA may be embodied through radio technology such as global system for mobile communications (GSM), general packet radio service (GPRS), or enhanced data rates for GSM evolution (EDGE). OFDMA may be embodied through radio technology such as institute of electrical and electronics engineers (IEEE) 802.11 (Wi-Fi), IEEE 802.16 (WiMAX), IEEE 802.20, or evolved UTRA (E-UTRA). UTRA is a part of a universal mobile telecommunications system (UMTS). 3rd generation partnership project (3GPP) long term evolution (LTE) is a part of evolved UMTS (E-UMTS) using E-UTRA. 3GPP LTE employs OFDMA in DL and SC-FDMA in UL. LTE-advanced (LTE-A) is an evolved version of 3GPP LTE. For convenience of description, it is assumed that the present disclosure is applied to 3GPP based communication system, e.g. LTE/LTE-A, NR. However, the technical features of the present disclosure are not limited thereto. For example, although the following detailed description is given based on a mobile communication system corresponding to a 3GPP LTE/LTE-A/NR system, aspects of the present disclosure that are not specific to 3GPP LTE/LTE-A/NR are applicable to other mobile communication systems.

In examples of the present disclosure described below, the expression that "assumes" may mean that a subject which transmits a channel transmits the channel in accordance with the corresponding "assumption". This may also mean that a subject which receives the channel receives or decodes the channel in a form conforming to the "assumption", on the assumption that the channel has been transmitted according to the "assumption".

In the present disclosure, a user equipment (UE) may be a fixed or mobile device. Examples of the UE include various devices that transmit and receive user data and/or various kinds of control information to and from a base station (BS). The UE may be referred to as a terminal equipment (TE), a mobile station (MS), a mobile terminal (MT), a user terminal (UT), a subscriber station (SS), a wireless device, a personal digital assistant (PDA), a wireless modem, a handheld device, etc. In addition, in the present disclosure, a BS generally refers to a fixed station that performs communication with a UE and/or another BS, and exchanges various kinds of data and control information with the UE and another BS. The BS may be referred to as an advanced base station (ABS), a node-B (NB), an evolved node-B (eNB), a base transceiver system (BTS), an access point (AP), a processing server (PS), etc. Particularly, a BS of a UTRAN is referred to as a Node-B, a BS of an E-UTRAN is referred to as an eNB, and a BS of a new radio access technology network is referred to as an gNB. Herein, for convenience of description, a base station will be referred to as a BS irrespective of communication technologies.

In the present disclosure, a node refers to a fixed point capable of transmitting/receiving a radio signal through communication with a UE. Various types of BSs may be used as nodes irrespective of the terms thereof. For example, a BS, a node B (NB), an e-node B (eNB), a pico-cell eNB (PeNB), a home eNB (HeNB), a relay, a repeater, etc. may be a node. In addition, the node may not be a BS. For example, the node may be a radio remote head (RRH) or a radio remote unit (RRU). The RRH or RRU generally has a lower power level than a power level of a BS. Since the RRH or RRU (hereinafter, RRH/RRU) is generally connected to the BS through a dedicated line such as an optical cable, cooperative communication between RRH/RRU and the BS can be smoothly performed in comparison with cooperative communication between BSs connected by a radio line. At least one antenna is installed per node. The antenna may mean a physical antenna or mean an antenna port or a virtual antenna.

In the present disclosure, a cell refers to a prescribed geographical area to which one or more nodes provide a communication service. Accordingly, in the present disclosure, communicating with a specific cell may mean communicating with a BS or a node which provides a communication service to the specific cell. In addition, a DL/UL signal of a specific cell refers to a DL/UL signal from/to a BS or a node which provides a communication service to the specific cell. A node providing UL/DL communication services to a UE is called a serving node and a cell to which UL/DL communication services are provided by the serving node is especially called a serving cell. Furthermore, channel status/quality of a specific cell refers to channel status/quality of a channel or communication link formed between a BS or node which provides a communication service to the specific cell and a UE. In the 3GPP based communication system, the UE may measure DL channel state received from a specific node using cell-specific reference signal(s) (CRS(s)) transmitted on a CRS resource and/or channel state information reference signal(s) (CSI-RS(s)) transmitted on a CSI-RS resource, allocated by antenna port(s) of the specific node to the specific node.

Meanwhile, a 3GPP based communication system uses the concept of a cell in order to manage radio resources and a cell associated with the radio resources is distinguished from a cell of a geographic region.

A "cell" of a geographic region may be understood as coverage within which a node can provide service using a carrier and a "cell" of a radio resource is associated with bandwidth (BW) which is a frequency range configured by the carrier. Since DL coverage, which is a range within which the node is capable of transmitting a valid signal, and UL coverage, which is a range within which the node is capable of receiving the valid signal from the UE, depends upon a carrier carrying the signal, the coverage of the node may be associated with coverage of the "cell" of a radio resource used by the node. Accordingly, the term "cell" may be used to indicate service coverage of the node sometimes, a radio resource at other times, or a range that a signal using a radio resource can reach with valid strength at other times.

Meanwhile, the 3GPP communication standards use the concept of a cell to manage radio resources. The "cell" associated with the radio resources is defined by combination of downlink resources and uplink resources, that is, combination of DL CC and UL CC. The cell may be configured by downlink resources only, or may be configured by downlink resources and uplink resources. If carrier aggregation is supported, linkage between a carrier frequency of the downlink resources (or DL CC) and a carrier frequency of the uplink resources (or UL CC) may be indicated by system information. For example, combination of the DL resources and the UL resources may be indicated by linkage of system information block type 2 (SIB2). The carrier frequency may be the same as a center frequency of each cell or CC. A cell operating on a primary frequency may be referred to as a primary cell (Pcell) or PCC, and a cell operating on a secondary frequency may be referred to as a secondary cell (Scell) or SCC. The carrier corresponding to the Pcell on downlink will be referred to as a downlink primary CC (DL PCC), and the carrier corresponding to the Pcell on uplink will be referred to as an uplink primary CC (UL PCC). A Scell means a cell that may be configured after completion of radio resource control (RRC) connection establishment and used to provide additional radio resources. The Scell may form a set of serving cells for the UE together with the Pcell in accordance with capabilities of the UE. The carrier corresponding to the Scell on the downlink will be referred to as downlink secondary CC (DL SCC), and the carrier corresponding to the Scell on the uplink will be referred to as uplink secondary CC (UL SCC). Although the UE is in RRC-CONNECTED state, if it is not configured by carrier aggregation or does not support carrier aggregation, a single serving cell configured by the Pcell only exists.

3GPP based communication standards define DL physical channels corresponding to resource elements carrying information derived from a higher layer and DL physical signals corresponding to resource elements which are used by a physical layer but which do not carry information derived from a higher layer. For example, a physical downlink shared channel (PDSCH), a physical broadcast channel (PBCH), a physical multicast channel (PMCH), a physical control format indicator channel (PCFICH), a physical downlink control channel (PDCCH), and a physical hybrid ARQ indicator channel (PHICH) are defined as the DL physical channels, and a reference signal and a synchronization signal are defined as the DL physical signals. A reference signal (RS), also called a pilot, refers to a special waveform of a predefined signal known to both a BS and a UE. For example, a cell-specific RS (CRS), a UE-specific RS (UE-RS), a positioning RS (PRS), and channel state information RS (CSI-RS) may be defined as DL RSs. Meanwhile, the 3GPP based communication standards define UL physical channels corresponding to resource elements carrying information derived from a higher layer and UL physical signals corresponding to resource elements which are used by a physical layer but which do not carry information derived from a higher layer. For example, a physical uplink shared channel (PUSCH), a physical uplink control channel (PUCCH), and a physical random access channel (PRACH) are defined as the UL physical channels, and a demodulation reference signal (DM RS) for a UL control/data signal and a sounding reference signal (SRS) used for UL channel measurement are defined as the UL physical signals.

In the present disclosure, a physical downlink control channel (PDCCH), a physical control format indicator channel (PCFICH), a physical hybrid automatic retransmit request indicator channel (PHICH), and a physical downlink shared channel (PDSCH) refer to a set of time-frequency resources or resource elements (REs) carrying downlink control information (DCI), a set of time-frequency resources or REs carrying a control format indicator (CFI), a set of time-frequency resources or REs carrying downlink acknowledgement (ACK)/negative ACK (NACK), and a set of time-frequency resources or REs carrying downlink data, respectively. In addition, a physical uplink control channel (PUCCH), a physical uplink shared channel (PUSCH) and a physical random access channel (PRACH) refer to a set of time-frequency resources or REs carrying uplink control information (UCI), a set of time-frequency resources or REs carrying uplink data and a set of time-frequency resources or REs carrying random access signals, respectively. In the present disclosure, in particular, a time-frequency resource or RE that is assigned to or belongs to PDCCH/PCFICH/PHICH/PDSCH/PUCCH/PUSCH/PRACH is referred to as PDCCH/PCFICH/PHICH/PDSCH/PUCCH/PUSCH/PRACH RE or PDCCH/PCFICH/PHICH/PDSCH/PUCCH/PUSCH/PRACH time-frequency resource, respectively. Therefore, in the present disclosure, PUCCH/PUSCH/PRACH transmission of a UE is conceptually identical to UCI/uplink data/random access signal transmission on PUSCH/PUCCH/PRACH, respectively. In addition, PDCCH/PCFICH/PHICH/PDSCH transmission of a BS is conceptually identical to downlink data/DCI transmission on PDCCH/PCFICH/PHICH/PDSCH, respectively.

For terms and technologies which are not described in detail in the present disclosure, reference can be made to the standard document of 3GPP LTE/LTE-A, for example, 3GPP TS 36.211, 3GPP TS 36.212, 3GPP TS 36.213, 3GPP TS 36.321, and 3GPP TS 36.331 and the standard document of 3GPP NR, for example, 3GPP TS 38.211, 3GPP TS 38.212, 3GPP TS 38.213, 3GPP TS 38.214, 3GPP TS 38.300 and 3GPP TS 38.331. In addition, as to polar codes and the principle of encoding and decoding using the polar codes, reference may be made to 'E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009'.

As more communication devices have demanded higher communication capacity, there has been necessity of enhanced mobile broadband relative to legacy radio access technology (RAT). In addition, massive machine type communication for providing various services irrespective of time and place by connecting a plurality of devices and objects to each other is one main issue to be considered in future-generation communication. Further, a communication system design in which services/UEs sensitive to reliability and latency are considered is under discussion. The introduction of future-generation RAT has been discussed by taking into consideration enhanced mobile broadband communication, massive MTC, ultra-reliable and low-latency communication (URLLC), and the like. In current 3GPP, a study of the future-generation mobile communication system after EPC is being conducted. In the present disclosure, the corresponding technology is referred to as a new RAT (NR) or 5G RAT, for convenience.

An NR communication system demands that much better performance than a legacy fourth generation (4G) system be supported in terms of data rate, capacity, latency, energy consumption, and cost. Accordingly, the NR system needs to make progress in terms of bandwidth, spectrum, energy, signaling efficiency, and cost per bit. NR needs to use efficient waveforms in order to satisfy these requirements.

FIG. 1 illustrates a transport block processing procedure in an LTE/LTE-A system.

In order for a receiving side to correct errors that signals experience in a channel, a transmitting side encodes information using a forward error correction code and then transmits the encoded information. The receiving side demodulates a received signal and decodes the error correction code to thereby recover the information transmitted by the transmitting side. In this decoding procedure, errors in the received signal caused by a channel are corrected.

Data arrives at a coding block in the form of a maximum of two transport blocks every transmission time interval (TTI) in each DL/UL cell. The following coding steps may be applied to each transport block of the DL/UL cell:

cyclic redundancy check (CRC) attachment to a transport block;
code block segmentation and CRC attachment to a code block;
channel coding;
rate matching; and
code block concatenation.

Although various types of error correction codes are available, a turbo code has mainly been used in a legacy LTE/LTE-A system. The turbo code is implemented by a recursive systematic convolution encoder and an interleaver. For actual implementation of the turbo code, an interleaver is used to facilitate parallel decoding and quadratic polynomial permutation (QPP) is a kind of interleaving. It is known that a QPP interleaver maintains good performance only for a data block of a specific size. It is known that performance of the turbo code increases with a larger data block size. In an actual communication system, a data block of a predetermined size or larger is divided into a plurality of smaller data blocks and then is encoded, to facilitate actual implementation of coding. The smaller data blocks are called code blocks. While the code blocks are generally of the same size, one of the code blocks may have a different size due to a limited size of the QPP interleaver. Error correction coding is performed on each code block of a predetermined interleaver size and then interleaving is performed to reduce the impact of burst errors that are generated during transmission over a radio channel. The error-corrected and interleaved code block is transmitted by being mapped to an actual radio resource. The amount of radio resources used for actual transmission is designated. Thus, the encoded code blocks are rate-matched to the amount of the radio resources. In general, rate matching is performed through puncturing or repetition. For example, if the amount of radio resources, i.e., the number of transmission bits capable of being transmitted on the radio resources, is M and if a coded bit sequence, i.e., the number of output bits of the encoder, is N, in which M is different from N, then rate matching is performed to match the length of the coded bit sequence to M. If M>N, then all or a part of bits of the coded bit sequence are repeated to match the length of the rate-matched sequence to M. If M<N, then a part of the bits of the coded bit sequence is punctured to match the length of the rate-matched sequence to M and the punctured bits are excluded from transmission.

Namely, in an LTE/LTE-A system, after data to be transmitted is encoded using channel coding having a specific code rate (e.g., ⅓), the code rate of the data to be transmitted is adjusted through a rate-matching procedure consisting of puncturing and repetition. When the turbo code is used as a channel code in the LTE/LTE-A system, a procedure of performing channel coding and rate-matching on each code block in the transport block processing procedure as illustrated in FIG. 1 is illustrated in FIG. 2.

Figure 2:
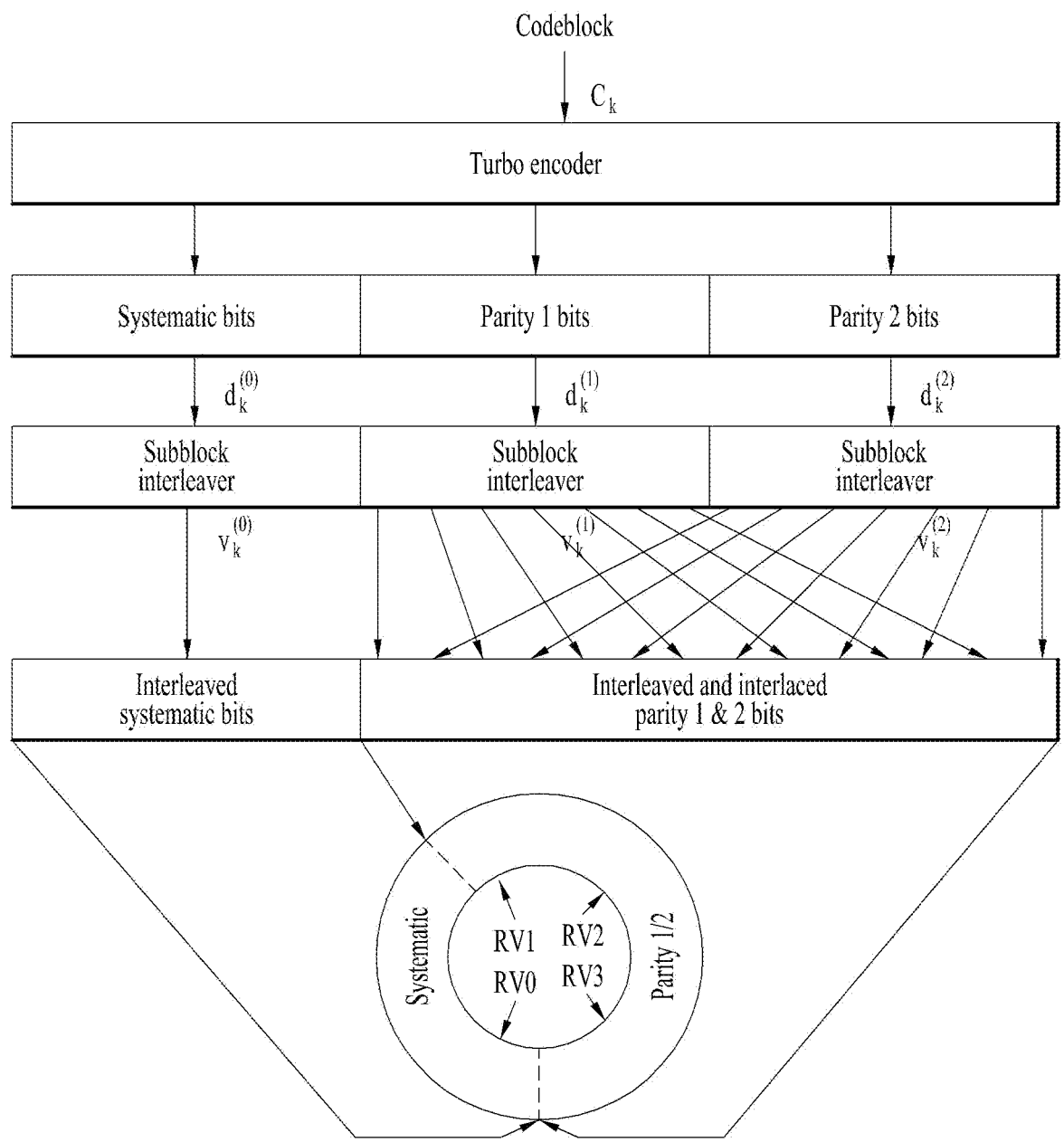
FIG. 2 is a block diagram illustrating rate matching performed by separating an encoded code block into a systematic part and a parity part.

FIG. 2 is a block diagram illustrating rate matching performed by separating an encoded code block into a systematic part and a parity part.

As illustrated in FIG. 2, the mother code rate of an LTE/LTE-A turbo encoder is ⅓. In order to obtain other code rates, if necessary, repetition or puncturing has to be performed, which are performed by a rate matching module. The rate matching module consists of three so-called sub-block interleavers for three output streams of the turbo encoder and a bit selection and pruning part, which is realized by a circular buffer. The sub-block interleaver is based on a classic row-column interleaver with 32 rows and length-32 intra-column permutation. The bits of each of the three streams are written row-by-row into a matrix with 32 columns (number of rows depends on stream size). Dummy bits are padded to the front of each stream to completely fill the matrix. After column permutation, bits are read out from the matrix column-by-column.

Figure 3:
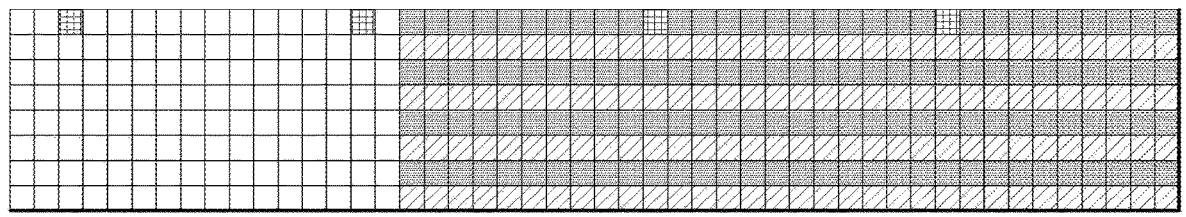
FIG. 3 illustrates an internal structure of a circular buffer.

FIG. 3 illustrates an internal structure of a circular buffer.

The circular buffer is the most important part of the rate matching module, making it possible to perform puncturing and repetition of a mother code. Referring to FIG. 2, the interleaved systematic bits are written into the circular buffer in sequence, with the first bit of the interleaved systematic bit stream at the beginning of the buffer. The interleaved and interlaced parity bit streams are written into the buffer in sequence, with the first bit of the stream next to the last bit of the interleaved systematic bit stream. Coded bits (depending on code rate) are read out serially from a certain starting point specified by redundancy version (RV) points in the circular buffer. If the coded bits reaches the end of the circular buffer and more coded bits are needed for transmission (in the case of a code rate smaller than ⅓), a transmitting device wraps around and continues at the beginning of the circular buffer.

HARQ, which stands for Hybrid ARQ, is an error correction mechanism based on retransmission of packets, which are detected with errors. The transmitted packet arrives at a receiving device after a certain propagation delay. The receiving device produces ACK for the case of error-free transmission or NACK for the case of detection of some errors. ACK/NACK is produced after some processing time and sent back to the transmitting device and arrives at the transmitting device after a propagation delay. In the case of NACK, after a certain processing delay in the transmitting device, a desired packet will be sent again. Bits, which are read out from the circular buffer and sent through retransmission, are different and depend on the position of the RV. There are four RVs (0, 1, 2, and 3), which define the position of a starting point at which the bits are read out from the circular buffer. Referring to FIG. 3, with the progressing number of retransmissions, the RV becomes higher and therefore fewer systematic bits and more parity bits are read out from the circular buffer for retransmission.

NR provides higher speeds and better coverage than current 4G. NR operates in a high frequency band and is required to offer speeds of up to 1 Gb/s for tens of connections or tens of Mb/s for tens of thousands of connections. To meet requirements of such an NR system, introduction of a more evolved coding scheme than a legacy coding scheme is under discussion. Since data communication arises in an incomplete channel environment, channel coding plays an important role in achieving a higher data rate for fast and error-free communication. A selected channel code needs to provide superior block error ratio (BLER) performance for block lengths and code rates of a specific range. Herein, BLER is defined as the ratio of the number of erroneous received blocks to the total number of sent blocks. In NR, low calculation complexity, low latency, low cost, and higher flexibility are demanded for a coding scheme. Furthermore, reduced energy per bit and improved region efficiency are needed to support a higher data rate. Use examples for NR networks are enhanced mobile broadband (eMBB), massive Internet of things (IoT), and ultra-reliable and low latency communication (URLLC). eMBB covers Internet access with high data rates to enable rich media applications, cloud storage and applications, and augmented reality for entertainment. Massive IoT applications include dense sensor networks for smart homes/buildings, remote health monitoring, and logistics tracking. URLLC covers critical applications that demand ultra-high reliability and low latency, such as industrial automation, driverless vehicles, remote surgery, and smart grids.

Although many coding schemes with high capacity performance at large block lengths are available, many of these coding schemes do not consistently exhibit excellent good performance in a wide range of block lengths and code rates. However, turbo codes, low-density parity check (LPDC) codes, and polar codes show promising BLER performance in a wide range of coding rates and code lengths and hence are considered to be used in the NR system. As demand for various cases such as eMBB, massive IoT, and URLLC has increased, a coding scheme providing greater channel coding efficiency than in turbo codes is needed. In addition, increase in a maximum number of subscribers capable of being accommodated by a channel, i.e., increase in capacity, has been required.

Polar codes are codes providing a new framework capable of solving problems of legacy channel codes and were invented by Arikan at Bilkent University (reference: E. Arikan, "Channel Polarization: A Method for Constructing Capacity-Achieving Codes for Symmetric Binary-Input Memoryless Channels," in IEEE Transactions on Information Theory, vol. 55, no. 7, pp. 3051-3073, July 2009). Polar codes are the first capacity-achieving codes with low encoding and decoding complexities, which were proven mathematically. Polar codes outperform the turbo codes in large block lengths while no error flow is present. Hereinafter, channel coding using the polar codes is referred to as polar coding.

Polar codes are known as codes capable of achieving the capacity of a given binary discrete memoryless channel. This can be achieved only when a block size is sufficiently large. That is, polar codes are codes capable of achieving the capacity of a channel if the size N of the codes infinitely increases. Polar codes have low encoding and decoding complexity and may be successfully decoded. Polar codes are a sort of linear block error correction codes. Multiple recursive concatenations are basic building blocks for the polar codes and are bases for code construction. Physical conversion of channels in which physical channels are converted into virtual channels occurs and such conversion is based on a plurality of recursive concatenations. If multiple channels are multiplied and accumulated, most of the channels may become better or worse. The idea underlying polar codes is to use good channels. For example, data is sent through good channels at rate 1 and data is sent through bad channels at rate 0. That is, through channel polarization, channels enter a polarized state from a normal state.

Figure 4:
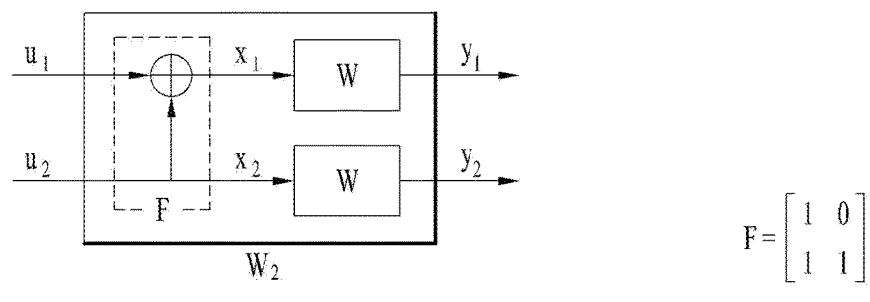
FIG. 4 is a block diagram for a polar code encoder.

FIG. 4 is a block diagram for a polar code encoder.

FIG. 4(a) illustrates a base module of a polar code, particularly, first level channel combining for polar coding. In FIG. 4(a), $W_2$ denotes an entire equivalent channel obtained by combining two binary-input discrete memoryless channels (B-DMCs), Ws. Herein, $u_1$ and $u_2$ are binary-input source bits and $y_1$ and $y_2$ are output coded bits. Channel combining is a procedure of concatenating the B-DMCs in parallel.

FIG. 4(b) illustrates a base matrix F for the base module. The binary-input source bits $u_1$ and $u_2$ input to the base matrix F and the output coded bits $x_1$ and $x_2$ of the base matrix F have the following relationship.

$$[u_1 u_2]\begin{bmatrix} 1 & 0 \\ 1 & 1 \end{bmatrix} = [x_1 x_2] \qquad \text{Equation 1}$$

The channel $W_2$ may achieve symmetric capacity I(W) which is a highest rate. In the B-DMC W, symmetric capacity is an important parameter which is used to measure a rate and is a highest rate at which reliable communication can occur over the channel W. The B-DMC may be defined as follows.

$$I(W) = \sum_{y \in Y} \sum_{x \in X} 1/2 W(y \mid x) \log \frac{w(y \mid x)}{1/2 w(y \mid 0) + 1/2 w(y \mid 1)} \qquad \text{Equation 2}$$

It is possible to synthesize or create a second set of N binary input channels out of N independent copies of a given B-DMC W and the channels have the properties $\{W_N^{(i)}: 1 \le i \le N\}$. If N increases, there is a tendency for a part of the channels to have capacity approximating to 1 and for the remaining channels to have capacity approximating to 0. This is called channel polarization. In other words, channel polarization is a process of creating a second set of N channels $\{W_N^{(i)}: 1 \le i \le N\}$ using N independent copies of a given B-DMC W. The effect of channel polarization means that, when N increases, all symmetric capacity terms $\{I(W_N^{(i)})\}$ tend towards 0 or 1 for all except a vanishing fraction of indexes i. In other words, the concept behind channel polarization in the polar codes is transforming N copies (i.e., N transmissions) of a channel having a symmetric capacity of I(W) (e.g., additive white Gaussian noise channel) into extreme channels of capacity close to 1 or 0. Among the N channels, an I(W) fraction will be perfect channels and an 1−I(W) fraction will be completely noise channels. Then, information bits are transmitted only through good channels and bits input to the other channels are frozen to 1 or 0. The amount of channel polarization increases along with a block length. Channel polarization consists of two phases: channel combining phase and channel splitting phase.

Figure 5:
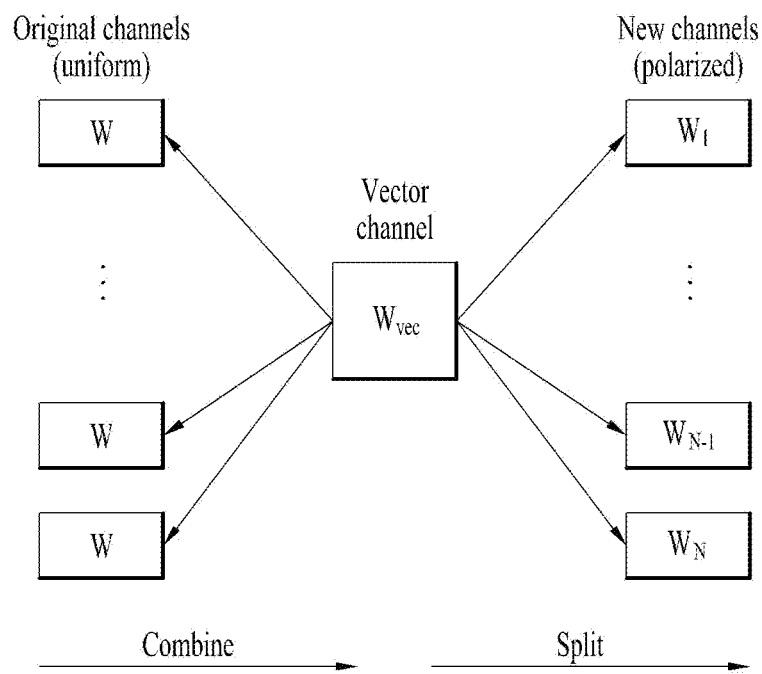
FIG. 5 illustrates the concept of channel combining and channel splitting for channel polarization.
Figure 5:
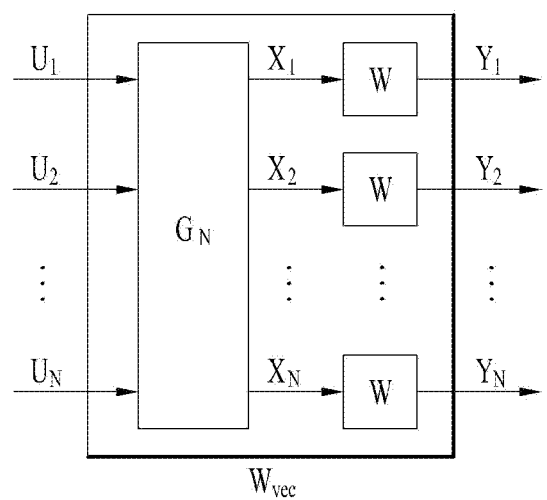

FIG. 5 illustrates the concept of channel combining and channel splitting for channel polarization. As illustrated in FIG. 5, when N copies of an original channel W are properly combined to create a vector channel $W_{vec}$ and then are split into new polarized channels, the new polarized channels are categorized into channels having capacity C(W)=1 and channels having C(W)=0 if N is sufficiently large. In this case, since bits passing through the channels having the channel capacity C(W))=1 are transmitted without error, it is better to transmit information bits therethrough and, since bits passing through the channels having capacity C(W)=0 cannot transport information, it is better to transport frozen bits, which are meaningless bits, therethrough.

Referring to FIG. 5, copies of a given B-DMC W are combined in a recursive manner to output a vector channel $W_{vec}$ given by $X_N \rightarrow Y_N$, where $N=2^n$ and n is an integer equal to or greater than 0. Recursion always begins at the 0th level and $W_1=W$. If n is 1 (n=1), this means the first level of recursion in which two independent copies of $W_1$ are combined. If the above two copies are combined, a channel $W_2$: $X_2 \rightarrow Y_2$ is obtained. A transitional probability of this new channel $W_2$ may be represented by the following equation.

$$W_2(y_1,y_2|u_1,u_2)=W(y_1|u_1 \oplus u_2)W(y_1|u_2) \quad \text{Equation 3}$$

If the channel $W_2$ is obtained, two copies of the channel $W_2$ are combined to obtain a single copy of a channel $W_4$. Such recursion may be represented by $W_4: X_4 \rightarrow Y_4$ having the following transitional probability.

$$W_4(y_1^4|u_1^4)=W_2(y_1^2|u_1 \oplus u_2, u_3 \oplus u_4)W_2(y_3^4|u_2,u_4) \quad \text{Equation 4}$$

In FIG. 5, $G_N$ is a size-N generator matrix. $G_2$ corresponds to the base matrix F illustrated in FIG. 4(b). $G_4$ may be represented by the following matrix.

$$G_4 = \begin{bmatrix} 1 & 0 & 0 & 0 \\ 0 & 0 & 1 & 0 \\ 0 & 1 & 0 & 0 \\ 0 & 0 & 0 & 1 \end{bmatrix} \begin{bmatrix} 1 & 0 \\ 1 & 1 \end{bmatrix} \otimes 2 = \begin{bmatrix} 1 & 0 & 0 & 0 \\ 1 & 0 & 1 & 0 \\ 1 & 1 & 0 & 0 \\ 1 & 1 & 1 & 1 \end{bmatrix} \quad \text{Equation 5}$$

Herein, $\otimes$ denotes the Kronecker product, $A^{\otimes n}=A \otimes A^{\otimes(n-1)}$ for all $n \geq 1$, $A^{\otimes 0}=1$.

The relationship between input $u_1^N$ to $G_N$ and output $x_1^N$ of $G_N$ of FIG. 5(b) may be represented as $x_1^N=u_1^N G_N$, where $x_1^N=\{x_1, \ldots, x_N\}$, $u_1^N=\{u_1, \ldots, u_N\}$ When N B-DMCs are combined, each B-DMC may be expressed in a recursive manner. That is, $G_N$ may be indicated by the following equation.

$$G_N = B_N F^{W_n} \quad \text{Equation 6}$$

Herein, $N=2^n$, $n \geq 1$, $F^{\otimes n}=F \otimes F^{\otimes(n-1)}$, and $F^{\otimes 0}=1$. $B_N$ is a permutation matrix known as a bit-reversal operation and $B_N=R_N(I_2 \otimes B_{N/2})$ and may be recursively computed. $I_2$ is a 2-dimensional identity matrix and this recursion is initialized to $B_2=I_2$. $R_N$ is a bit-reversal interleaver and is used to map an input $s_1^N=\{s_1, \ldots s_N\}$ to an output $x_1^N=\{s_1, s_3, \ldots, s_{N-1}, s_2, \ldots, s_N\}$. The bit-reversal interleaver may not be included in a transmitting side. The relationship of Equation is illustrated in FIG. 6.

Figure 6:
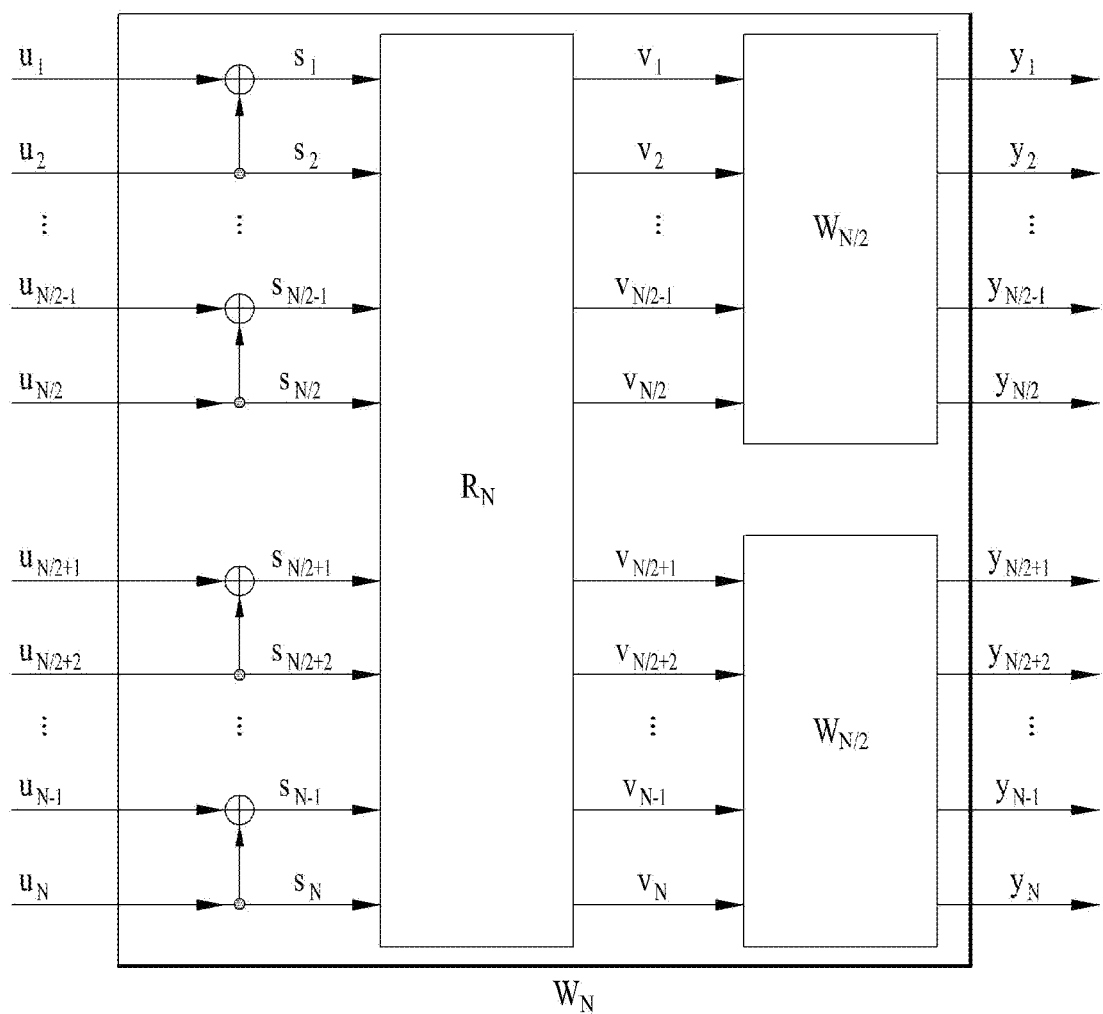
FIG. 6 illustrates N-th level channel combining for a polar code.

FIG. 6 illustrates N-th level channel combining for a polar code.

A process of defining an equivalent channel for specific input after combining N B-DMCs Ws is called channel input. Channel splitting may be represented as a channel transition probability indicated by the following equation.

$$W_N^i(y_1^N, u_1^{i-1} | u_i) = \sum_{u_{i+1}^N} \frac{1}{2^{N-1}} W_N(y_1^N | u_1^N) \quad \text{Equation 7}$$

Channel polarization has the following characteristics:
> Conservation: $C(W^-)+C(W^+)=2C(W)$,
> Extremization: $C(W^-) \leq C(W) \leq C(W^+)$.

When channel combining and channel splitting are performed, the following theorem may be obtained.

* Theorem: For any B-DMC W, channels $\{W_N^{(i)}\}$ are polarized in the following sense. For any fixed $\delta \in \{0,1\}$, as N goes to infinity through powers of 2, the fraction of indexes $i \in \{1, \ldots, N\}$ for channel capacity $I(W_N^{(i)}) \in (1-\delta, 1]$ goes to I(W) and the faction of i for channel capacity $I(W_N^{(i)}) \in [0,\delta)$ goes to 1–I(W). Hence, if $N \rightarrow \infty$, then channels are perfectly noisy or are polarized free of noise. These channels can be accurately recognized by the transmitting side. Therefore, bad channels are fixed and non-fixed bits may be transmitted on good channels.

That is, if the size N of polar codes is infinite, a channel has much noise or is free of noise, with respect to a specific input bit. This has the same meaning that the capacity of an equivalent channel for a specific input bit is divided into 0 or I(W).

Inputs of a polar encoder are divided into bit channels to which information data is mapped and bit channels to which the information data is not mapped. As described earlier, according to the theorem of the polar code, if a codeword of the polar code goes to infinity, the input bit channels may be classified into noiseless channels and noise channels. Therefore, if information is allocated to the noiseless bit channels, channel capacity may be obtained. However, in actuality, a codeword of an infinite length cannot be configured, reliabilities of the input bit channels are calculated and data bits are allocated to the input bit channels in order of reliabilities. In the present disclosure, bit channels to which data bits are allocated are referred to as good bit channels. The good bit channels may be input bit channels to which the data bits are mapped. Bit channels to which data is not mapped are referred to as frozen bit channels. A known value (e.g., 0) is input to the frozen bit channels and then encoding is performed. Any values which are known to the transmitting side and the receiving side may be mapped to the frozen bit channels. When puncturing or repetition is performed, information about the good bit channels may be used. For example, positions of codeword bits (i.e., output bits) corresponding to positions of input bits to which information bits are not allocated may be punctured.

A decoding scheme of the polar codes is a successive cancellation (SC) decoding scheme. The SC decoding scheme obtains a channel transition probability and then calculates a likelihood ratio (LLR) of input bits using the channel transition probability. In this case, the channel transition probability may be calculated in a recursive form if channel combining and channel splitting procedures use characteristics of the recursive form. Therefore, a final LLR value may also be calculated in the recursive form. First, a channel transition probability $W_N^{(i)}(y_1^N, u_1^{i-1}|u_1)$ of an input bit $u_1^i$ may be obtained as follows. $u_1^i$ may be split into odd indexes and even indexes as expressed as $u_{1,o}^i$, $u_{1,e}^i$, respectively. The channel transition probability may be indicated by the following equations.

$$W_{2N}^{(2i-1)}(y_1^{2N}, u_1^{2i-1} | u_{2i-1}) = \sum_{u_{2i}^{2N}} \frac{1}{2^{2N-1}} W_{2N}(y_1^{2N} | u_1^{2N}) \quad \text{Equation 8}$$

$$= \sum_{u_{2i,o}^{2N}, u_{2i,e}^{2N}} \frac{1}{2^{2N-1}} W_N$$

$$(y_1^N | u_{1,o}^{2N} \oplus u_{i,e}^{2N}) W_N(y_{N+1}^{2N} | u_{1,e}^{2N})$$

$$= \sum_{u_{2i}} \frac{1}{2} \sum_{u_{2i+1,e}^{2N}} \frac{1}{2^{N-1}} W_N$$

$$(y_{N+1}^{2N} | u_{1,e}^{2N}) \cdot \sum_{u_{2i+1,o}^{2N}} \frac{1}{2^{N-1}} W_N$$

$$(y_1^N | u_{1,o}^{2N} \oplus u_{i,e}^{2N})$$

$$= \sum_{u_{2i}} \frac{1}{2} W_N^{(i)}$$

$$(y_1^N, u_{1,o}^{2i-2} \oplus u_{i,e}^{2i-2} | u_{2i-1} \oplus u_{2i}) \cdot$$

$$W_N^{(i)}(y_{N+1}^{2N}, u_{1,e}^{2i-2} | u_{2i})$$

where $W_N^{(i)}(y_1^N, u_1^{i-1} | u_i) = \sum_{u_{i+1}^N} \frac{1}{2^{N-1}} W_N(y_1^N | u_1^N)$.

$$W_{2N}^{(2i)}(y_1^{2N}, u_1^{2i-1} | u_{2i}) = \sum_{u_{2i+1}^{2N}} \frac{1}{2^{2N-1}} W_{2N}(y_1^{2N} | u_1^{2N}) \quad \text{Equation 9}$$

$$= \sum_{u_{2i+1,o}^{2N}, u_{2i+1,e}^{2N}} \frac{1}{2^{2N-1}} W_N$$

$$(y_1^N | u_{1,o}^{2N} \oplus u_{i,e}^{2N}) W_N(y_{N+1}^{2N} | u_{1,e}^{2N})$$

$$= \frac{1}{2} \sum_{u_{2i+1,e}^{2N}} \frac{1}{2^{N-1}} W_N(y_{N+1}^{2N} | u_{1,e}^{2N}) \cdot$$

$$\sum_{u_{2i+1,o}^{2N}} \frac{1}{2^{N-1}} W_N(y_1^N | u_{1,o}^{2N} \oplus u_{i,e}^{2N})$$

$$= \frac{1}{2} W_N^{(i)}(y_1^N, u_{1,o}^{2i-2} \oplus u_{i,e}^{2i-2} | u_{2i-1} \oplus u_{2i}) \cdot$$

$$W_N^{(i)}(y_{N+1}^{2N}, u_{1,e}^{2i-2} | u_{2i})$$

A polar decoder retrieves information and generates an estimate $\hat{u}_1^N$ of $u_1^N$ using values (e.g., reception bits, frozen bits, etc.) known for the polar codes. The LLR is defined as follows.

$$L_N^{(i)}(y_1^N, u_1^{i-1}) = \frac{W_N^{(i)}(y_1^N, u_1^{i-1} | u_i = 0)}{W_N^{(i)}(y_1^N, u_1^{i-1} | u_i = 1)} \quad \text{Equation 10}$$

The LLR may be recursively calculated as follows.

$$L_N^{(2i-1)}(y_1^N, \hat{u}_1^{2i-2}) = \frac{L_{N/2}^{(i)}(y_1^{N/2}, \hat{u}_{1,o}^{2i-2} \oplus \hat{u}_{1,e}^{2i-2}) \cdot L_{N/2}^{(i)}(y_{N/2+1}^N, \hat{u}_{1,e}^{2i-2}) + 1}{L_{N/2}^{(i)}(y_1^{N/2}, \hat{u}_{1,o}^{2i-2} \oplus \hat{u}_{1,e}^{2i-2}) + L_{N/2}^{(i)}(y_{N/2+1}^N, \hat{u}_{1,e}^{2i-2})} \quad \text{Equation 11}$$

$$L_N^{(2i)}(y_1^N, \hat{u}_1^{2i-2}) =$$

$$[L_{N/2}^{(i)}(y_1^{N/2}, \hat{u}_{1,o}^{2i-2} \oplus \hat{u}_{1,e}^{2i-2})]^{1-2\hat{u}_{2i-1}} \cdot L_{N/2}^{(i)}(y_{N/2+1}^N, \hat{u}_{1,e}^{2i-2})$$

Recursive calculation of LLRs is traced back to a code length of 1 with an LLR $L_1^{(1)(y'_1)} = W(y_i|0)/W(y_i|1)$. $L_1^{(1)(y'_i)}$ is soft information observed from a channel.

The complexity of a polar encoder and an SC decoder varies with the length N of polar codes and is known as having O(NlogN). Assuming that K input bits are used for a length-N polar code, a coding rate becomes N/K. If a generator matrix of a polar encoder of a data payload size N is $G_N$, an encoded bit may be represented as $x_1^N = u_1^N G_N$. It is assumed that K bits out of $u_1^N$ correspond to payload bits, a row index of $G_N$ corresponding to the payload bits is i, and a row index of $G_N$ corresponding to (N-K) bits is F. A minimum distance of the polar codes may be given as $d_{min}(C) = \min_{i \in I} 2^{wt(i)}$, where wt(i) is the number of is within binary extension of i and i=0, 1, ..., N-1.

SC list (SCL) decoding is an extension of a basic SC decoder. In this type of decoder, L decoding paths are simultaneously considered in each decoding stage. Herein, L is an integer. In other words, in the case of the polar codes, a list-L decoding algorithm is an algorithm for simultaneously tracking L paths in a decoding process.

Figure 7:
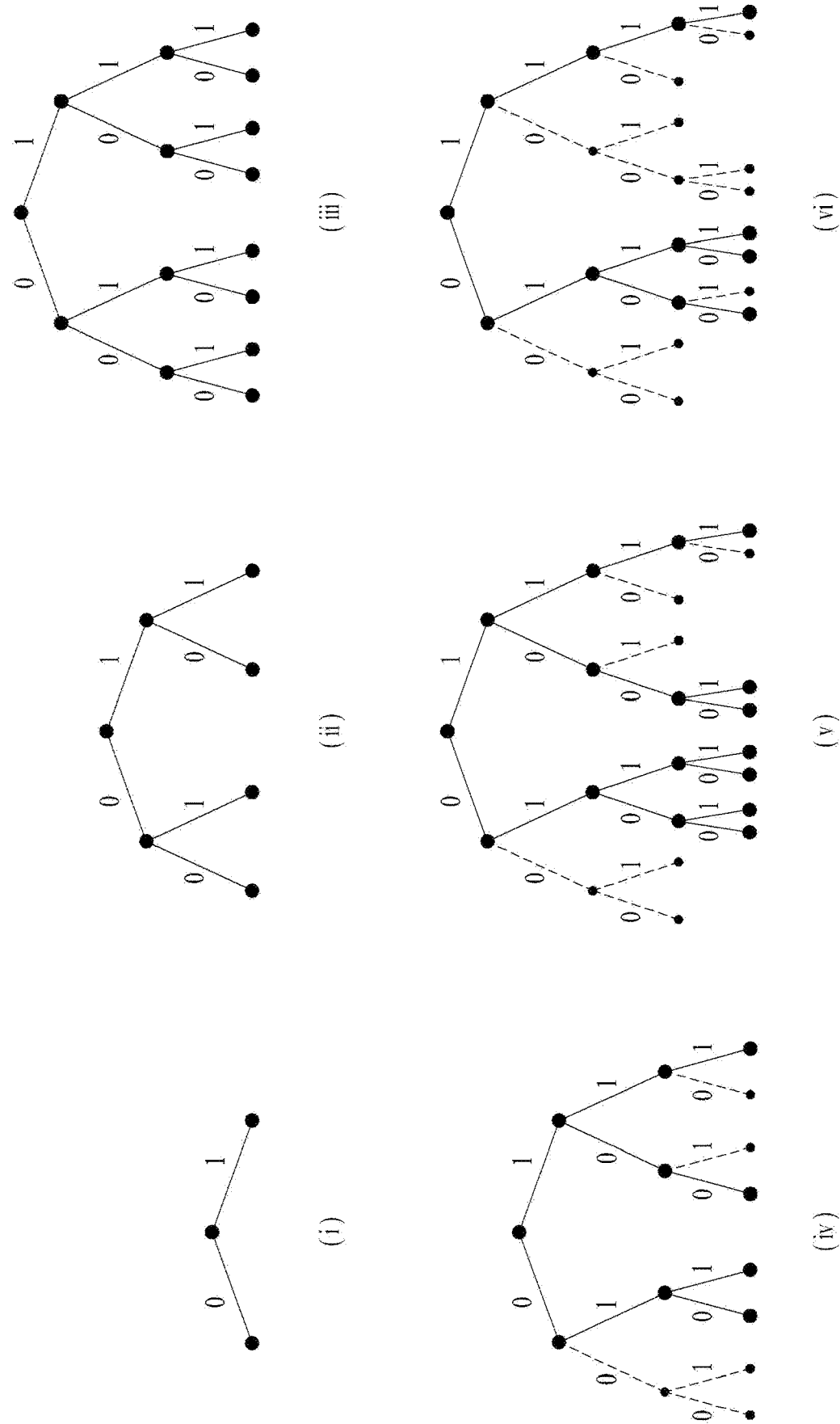
FIG. 7 illustrates an evolution of decoding paths in a list-L decoding process.

FIG. 7 illustrates an evolution of decoding paths in a list-L decoding process. For convenience of description, it is assumed that the number of bits that should be determined is n and all bits are not frozen. If a list size L is 4, each level includes at most 4 nodes with paths that continue downward. Discontinued paths are expressed by dotted lines in FIG. 7. A process in which decoding paths evolve in list-L decoding will now be described with reference to FIG. 7. i) If list-L decoding is started, the first unfrozen bit may be either 0 or 1. ii) list-L decoding continues. The second unfrozen bits may be either 0 or 1. Since the number of paths is not greater than L=4, pruning is not needed yet. iii) Consideration of all options for the first bit (i.e., a bit of the first level), the second bit (i.e. a bit of the second level), and the third bit (i.e., a bit of the third level) results in 8 decoding paths which are excessive because L=4. iv) the 8 decoding paths are pruned to L (=4) promising paths. v) 4 active paths continue by considering two options of the fourth unfrozen bit. In this case, the number of paths is doubled, i.e., 8 paths which are excessive because L=4. vi) The 8 paths are pruned back to L (=4) best paths. In the example of FIG. 7, 4 candidate codewords 0100, 0110, 0111, and 1111 are obtained and one of the codewords is determined to be a codeword most similar to an original codeword. In a similar manner to a normal decoding process, for example, in a pruning process or a process of determining a final codeword, a path in which the sum of LLR absolute values is largest may be selected as a survival path. If a CRC is present, the survival path may be selected through the CRC.

Meanwhile, CRC-aided SCL decoding is SCL decoding using CRC and improves the performance of polar codes. CRC is the most widely used technique in error detection and error correction in the field of information theory and coding. For example, if an input block of an error correction encoder has K bits and the length of information bits is k, and the length of CRC sequences is m bits, then K=k+m. CRC bits are a part of source bits for an error correction code. If the size of channel codes used for encoding is N, a code rate R is defined as R=K/N. CRC aided SCL decoding serves to detect an errorless path while a receiving device confirms a CRC code with respect to each path. An SCL decoder outputs candidate sequences to a CRC detector. The CRC detector feeds back a check result in order to aid in determining a codeword.

Although complicated as compared with an SC algorithm, SCL decoding or CRC aided SCL decoding has an advantage of excellent decoding performance. For more details of a list-X decoding algorithm of the polar codes, refer to 'I. Tal and A. Vardy, "List decoding of polar codes," in Proc. IEEE Int. Symp. Inf. Theory, pp. 1-5, Jul. 2011'.

In the polar codes, code design is independent of a channel and hence is not versatile for mobile fading channels. In addition, the polar codes have a disadvantage of limited application because the codes have recently been introduced and have not grown yet. That is, polar coding proposed up to now has many parts that have not been defined to apply to a wireless communication system. Therefore, the present disclosure proposes a polar coding method suitable for the wireless communication system.

Figure 8:
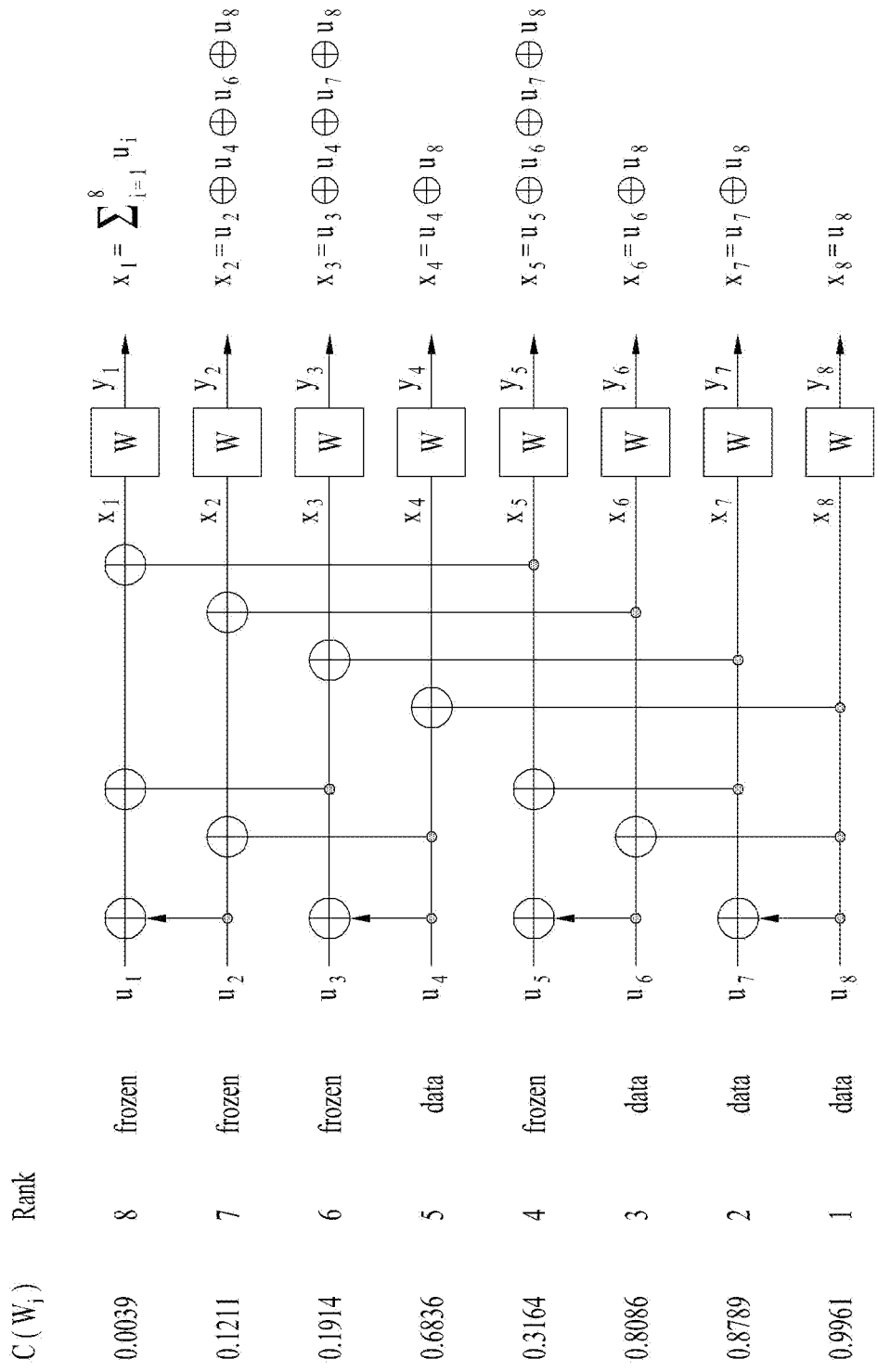
FIG. 8 illustrates the concept of selecting position(s) to which information bit(s) are to be allocated in polar codes.

FIG. 8 illustrates the concept of selecting position(s) to which information bit(s) are to be allocated in polar codes.

In FIG. 8, it is assumed that the size N of mother codes is 8, i.e., the size N of polar codes is 8, and a code rate is ½.

In FIG. 8, $C(W_i)$ denotes the capacity of a channel W, and corresponds to the reliability of channels that input bits of a polar code experience. When channel capacities corresponding to input bit positions of the polar code are as illustrated in FIG. 8, reliabilities of the input bit positions are ranked as illustrated in FIG. 8. To transmit data at a code rate of ½, a transmitting device allocates 4 bits constituting the data to 4 input bit positions having high channel capacities among 8 input bit positions (i.e., input bit positions denoted as $U_4$, $U_6$, $U_7$, and $U_4$ among input bit positions $U_1$ to $U_8$ of FIG. 8) and freezes the other input bit positions. A generator matrix $G_8$ corresponding to the polar code of FIG. 8 is as follows. The generator matrix $G_8$ may be acquired based on Equation 6.

$$G_8 = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \quad \text{Equation 12}$$

The input bit positions denoted as $U_1$ to $U_8$ of FIG. 8 correspond one by one to rows from the lowest row to the highest row of $G_8$. Referring to FIG. 8, it may be appreciated that the input bit corresponding to $U_8$ affects all output coded bits. On the other hand, it may be appreciated that the input bit corresponding to $U_1$ affects only $Y_1$ among the output coded bits. Referring to Equation 12, when binary-input source bits $U_1$ to $U_8$ are multiplied by $G_8$, a row in which the input bits appear at all output bits is the lowest row [1, 1, 1, 1, 1, 1, 1, 1] in which all elements are 1, among rows of $G_8$. Meanwhile, a row in which the binary-input source bits appears at only one output bit is a row in which one element is 1 among the rows of $G_8$, i.e., a row [1, 0, 0, 0, 0, 0, 0, 0] in which a row weight is 1. Similarly, it may be appreciated that a row in which a row weight is 2 reflects input bits corresponding to the row in two output bits. Referring to FIG. 8 and Equation 12, $U_1$ to $U_8$ correspond one by one to the rows of $G_8$ and bit indexes for distinguishing between input positions of $U_1$ to $U_8$, i.e., bit indexes for distinguishing between the input positions, may be assigned to the rows of $G_8$.

Hereinafter, for Polar codes, it may be assumed that bit indexes from 0 to N−1 are sequentially allocated to rows of $G_N$ starting from the highest row having the smallest row weight with respect to N input bits. For example, referring to FIG. 8, a bit index 0 is allocated to the input position of $U_1$, i.e., the first row of $G_8$ and a bit index 7 is allocated to the input position of $U_8$, i.e., the last row of $G_8$. However, since the bit indexes are used to indicate input positions of the polar code, a scheme different from the above allocation scheme may be used. For example, bit indexes from 0 to N−1 may be allocated staring from the lowest row having the largest row weight.

In the case of output bit indexes, as illustrated in FIG. 8 and Equation 12, it may be assumed that bit indexes from 0 to N−1 or bit indexes from 1 to N are assigned to columns from the first column having the largest column weight to the last column having the smallest column weight among columns of $G_N$.

In Polar codes, setting of information bits and frozen bits is one of the most important elements in the configuration and performance of the polar code. That is, determination of ranks of input bit positions may be an important element in the performance and configuration of the polar code. For Polar codes, bit indexes may distinguish input or output positions of the polar code. In the present disclosure, a sequence obtained by enumerating reliabilities of bit positions in ascending or descending order are referred to as a bit index sequence. That is, the bit index sequence represents reliabilities of input or output bit positions of the polar code in ascending or descending order. A transmitting device inputs information bits to input bits having high reliabilities based on the input bit index sequence and performs encoding using the polar code. A receiving device may discern input positions to which information bits are allocated or input positions to which frozen bits are allocated, using the same or corresponding input bit index sequence. That is, the receiving device may perform polar decoding using an input bit index sequence which is identical to or corresponds to an input bit sequence used by the transmitting device and using a corresponding polar code. In the following description, it may be assumed that an input bit sequence is predetermined so that information bit(s) may be allocated to input bit position(s) having high reliabilities.

Figure 9:
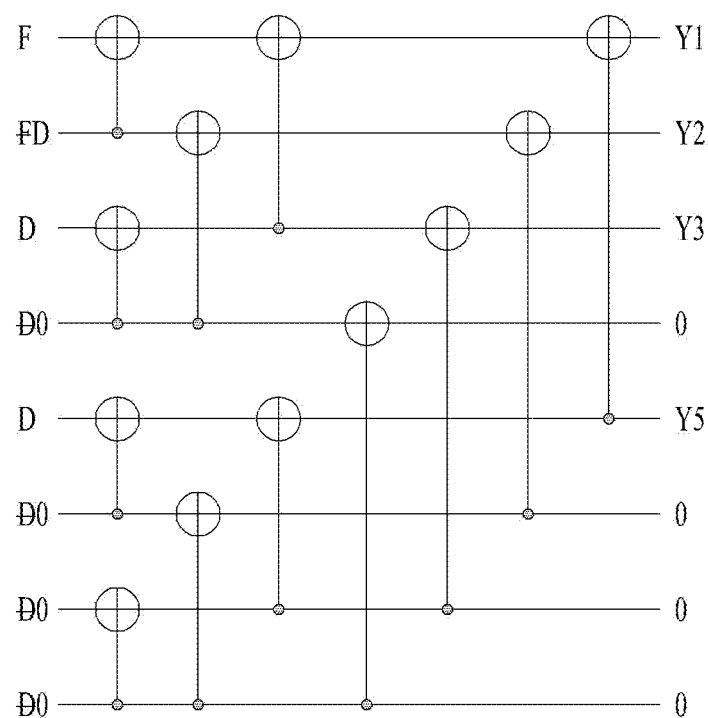
FIG. 9 illustrates puncturing and information bit allocation according to the present disclosure.

FIG. 9 illustrates puncturing and information bit allocation for polar codes. In FIG. 9, F denotes a frozen bit, D denotes an information bit, and 0 denotes a skipping bit.

Among coded bits, the case in which an information bit is changed to a frozen bit may occur according to an index or position of a punctured bit. For example, if output coded bits for a mother code of N=8 should be punctured in order of Y8, Y7, Y6, Y4, Y5, Y3, Y2, and Y1 and a target code rate is ½, then Y8, Y7, Y6, and Y4 are punctured, U8, U7, U6, and U4 connected only to Y8, Y7, Y6, and Y4 are frozen to 0, and these input bits are not transmitted, as illustrated in FIG. 9. An input bit changed to a frozen bit by puncturing of a coded bit is referred to as a skipping bit or a shortening bit and a corresponding input position is referred to as a skipping position or a shortening position. Shortening is a rate matching method of inserting a known bit into an input bit position connected to a position of an output bit desired to be transmitted while maintaining the size of input information (i.e., the size of information blocks). Shortening is possible starting from input corresponding to a column in which a column weight is 1 in a generator matrix $G_N$ and next shortening may be performed with respect to input corresponding to a column in which a column weight is 1 in a remaining matrix from which a column and row in which a column weight is 1 are removed. To prevent all information bits from being punctured, an information bit that should have been allocated to an information bit position may be reallocated in order of a high reliability within a set of frozen bit positions.

In the case of the polar code, decoding may be generally performed in the following order.

>1. Bit(s) having low reliabilities are recovered first. Although reliability differs according to the structure of a decoder, since an input index in an encoder (hereinafter, an encoder input index) having a low value usually has a low reliability, decoding is generally performed staring from a low encoder input index.

>2. When there is a known bit for a recovered bit, the known bit is used together with the recovered bit or the process of 1 is omitted and a known bit for a specific input bit position is immediately used, thereby recovering an information bit, which is an unknown bit. The information bit may be a source information bit (e.g., a bit of a transport block) or a CRC bit.

Figure 10:
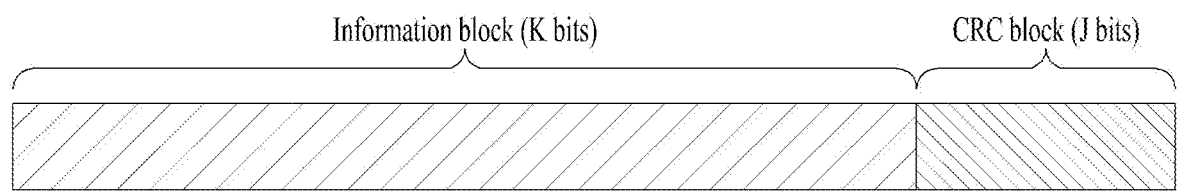
FIG. 10 illustrates the concepts of a conventional CRC code and a distributed CRC code.
Figure 10:
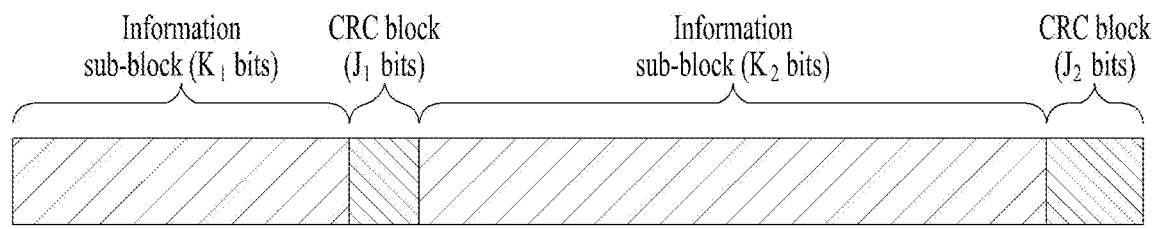

FIG. 10 illustrates the concepts of a conventional CRC code and a distributed CRC code. FIG. 10(a) illustrates conventional CRC, and FIG. 10(b) illustrates distributed CRC.

In the polar code, a CRC-aided list (CAL) decoding method is widely used due to superior decoding performance thereof. According to the CAL decoding method, L candidate information bit sequences, $\{u_i: i=1, \ldots, L\}$ (where L is a positive integer) are first decoded. Then, CRC-CHECK is performed for the candidate information bit sequences, and a candidate sequence that passes CRC-CHECK is selected as a decoded information bit sequence.

In general, CRC bits are located after information bits as shown in FIG. 10(a). Thus, a decoder generally decodes all information bits and then performs CRC-CHECK for the decoded information bits. In recent years, distributed CRC has been proposed to improve the decoding speed of the CAL decoding method. In the distributed CRC, CRC bits are appropriately distributed over information bits as shown in FIG. 10(b). When the distributed CRC is used as shown in FIG. 10(a), a decoder may decode some information bits (e.g., an information sub-block consisting of $K_1$ bits) and some CRC bits (e.g., a CRC block consisting of $J_1$ bits) during a CAL decoding process and perform CRC-CHECK for the decoded bits. In this case, if CRC-CHECK for all the L candidate information bit sequences fails, the decoder may declare an error and stop the decoding. That is, when the distributed CRC is used, early termination of decoding is enabled during the CAL decoding process. If decoding of a received signal is capable of being terminated early, a receiving device can rapidly determine whether the received signal is for the corresponding receiving device, whereby the receiving device may rapidly discover a signal therefor as well. Further, since an error in the received signal is rapidly detected, retransmission for the received signal or next transmission after the received signal may be rapidly performed as well.

However, to use the distributed CRC during a decoding process, it needs to be determined how CRC bits are distributed over information bits. Accordingly, the present disclosure proposes distributed CRC and a polar decoding method using the same to improve the decoding speed when the polar code is used. In particular, the present disclosure proposes a bit interleaver suitable for a distributed CRC scheme. In other words, the present disclosure provides a method of distributing CRC bits to achieve early termination in CAL decoding.

Figure 11:
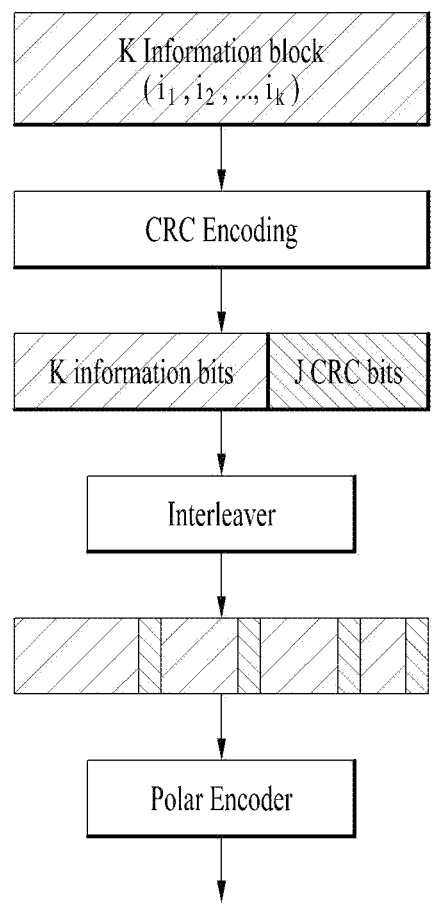
FIG. 11 illustrates an encoding procedure based on a polar code using a distributed CRC scheme.

FIG. 11 illustrates an encoding procedure based on a polar code using a distributed CRC scheme. Referring to FIG. 11, K information bits ($i_1, i_2, \ldots, i_K$) are CRC-encoded into a CRC-encoded bit sequence with a size of K+J by a CRC encoder configured to add J CRC bits to the information bits. Generally, the CRC encoder is configured to add a CRC code with a size of J to the end of the K information bits. The present disclosure is directed to a bit interleaver for changing the positions of bits in the CRC-encoded bit sequence with the size of K+J. In particular, the present disclosure relates to design of the interleaver block shown in FIG. 11. For example, assuming that K=10 and J=4 in FIG. 11, if no interleaver is used in FIG. 11, an input of "$i_1,i_2,i_3,i_4,i_5,i_6,i_7,i_8,i_9,i_{10},p_1,p_2,p_3,p_4$", which is a simple concatenation of the K information bits (K=10) and the J CRC bits (J=4), may be input to the polar encoder. Here, "$i_1,i_2,i_3,i_4,i_5,i_6,i_7,i_8,i_9,i_{10}$" represents the information bits, and "$p_1,p_2,p_3,p_4$" represents the CRC bits. In FIG. 11, if an interleaver, i.e., Int=(1, 2, 4, 11, 7, 8, 9, 13, 5, 6, 12, 3, 14) is used, an input of "$i_1, i_2,i_4,p_1,i_7,i_8,i_9,p_3,i_5,i_6,p_2,i_3,p_4$" may be input to the polar encoder. That is, when an interleaver is applied to a sequence consisting of information bits and CRC bits, the CRC bits may be distributedly arranged. The present disclosure proposes a method of designing an interleaver, and the bit interleaver according to the present disclosure may be implemented as follows.

Bit Interleaver

In the present disclosure, Int patterns are obtained by inputting candidate seed values to a bit interleaver algorithm according to the present disclosure, and among the obtained Int patterns, an optimal seed value(s) that generates an Int pattern(s) with the best performance is calculated. In this case, a seed value that generates an interleaving pattern having good performance in terms of early termination of CAL decoding using distributed CRC may be selected as the optimal seed value. For example, according to the present disclosure, a seed value that minimizes the sum of position indices of a predetermined number of parity bits in an interleaver pattern (a pattern consisting of the indices of interleaved bits), that is, places the predetermined number of parity bits at the front side of the interleaver pattern may be determined as the optimal seed value. Input parameters of the bit interleaver algorithm, candidate seed values, and output values thereof may be represented as follows.

* Input: information bit size K, CRC bit size J, K*(K+J) CRC generator matrix G = $[I_K{}^*{}_K; P_K{}^*{}_J]$, where $I_K{}^*{}_K$ is a K*K identity matrix.
* Seed value: s = ($j_1, \ldots, j_J$) (permutation of (1, ..., J)).
* Output: A set of K+J interleaved indices Int Here, the seed value s is a permutation of parity bit indices, i.e., CRC bit indices. For example, when the seed value s is (1, 3, 2, 4), which is a permutation of CRC bit indices of (1, 2, 3, 4), the seed value s may change the order of CRC bits from "$p_1,p_2,p_3,p_4$" to "$p_1,p_3,p_2,p_4$".

To calculate the seed value for the optimal interleaver pattern, the interleaver pattern Int needs to be calculated for each candidate seed value. For example, the algorithm in Table 1 below may be used to determine the positions of parity bits and information bits based on a given seed value and CRC generator matrix. In other words, the algorithm below may be used to calculate a sequence of interleaved indices based on a seed value and a CRC generator. Considering that a relationship between the parity and information bits is determined by the CRC polynomial (i.e., CRC generator matrix), a unique sequence of interleaved indices, i.e., a unique interleaving pattern may be obtained by the following algorithm.

TABLE 1

```
* Initialization:
    S = [ ] // empty set
    u = 0
* Algorithm (Pseudocode):
for j = 1 to J
    t = P_{K*J}(:, s(j)) // s(j)-th column of the matrix P_{K*J}
    Φ = find(t) // Φ contains the indices of non-zero locations in t    -- (1)
    ε = Φ \S // set difference Φ – S    -- (2)
    for k = 1 to |ε| // |ε| denotes the number of elements in ε
        Int(u + k) = ε(k)    -- (3)
    end
    Int(u + |ε| +k) = K + s(j)    -- (4)
    u = u + length(ε) + 1
    S = S ∪ ε
end
```

In Table 1, ":" of $P_{K*J}(:, s(j))$ denotes all rows, and thus $P_{K*J}(:, s(j))$ refers to an s(j)-th column of the matrix $P_{K*J}$. In addition, s(j) denotes the value of an j-th element in a seed vector. For example, in the case of s=(1, 3, 2, 4), s(1), s(2), s(3), and s(4) denote 1, 3, 2, and 4, respectively. Equation (1) in Table 1 denotes the position(s) of an input bit(s) used to generate a parity bit, that is, input bit(s) connected to the corresponding parity bit. In other words, Equation (1) calculates an information bit that needs to be placed before a selected parity bit. Equation (2) in Table 1 denotes the position(s) of a new input bit(s) not included in a previous parity bit. In other words, Equation (2) calculates an information bit except bits connected to a parity bit(s) prior to a currently added parity bit (hereinafter referred to as a current parity bit) among information bits that need to be placed before the current parity bit. Since S denotes the position(s) of an input bit(s) used to generate a previous parity bit(s) and c denotes the position(s) of an input bit(s) used to generate a new parity bit(s), the algorithm in Table 1 may be used for generating parity bits using the previous parity bit(s) and the new input bit(s). Equation (3) in Table 1 represents the position of the new input bit of Equation (2), and the new input bit needs to be placed before the added parity bit. Equation (4) represents the position of the parity bit generated by Equation (2).

Hereinafter, Examples 1, 2, 3, and 4 will be described in detail for better understanding of the present disclosure.

EXAMPLE 1

In Example 1, a method of implementing a length-16 interleaver using the algorithm proposed in the present disclosure when the number of information bits K and the number of CRC bits J are 12 and 4, respectively, will be described.

* Input: K=12, J=4, s=(1, 3, 2, 4), and G=[$I_{12*12}$,$P_{12*4}$], where $P_{12*4}$ is shown in Equation 13 below. In this case, a generator polynomial used for a CRC code, i.e., a CRC polynomial is determined in each communication system, and the generator matrix G is just a different name of the CRC polynomial. Thus, a unique party matrix is obtained from a given CRC polynomial.

$$P_{12 \times 4} = \begin{bmatrix} 0 & 0 & 0 & 1 \\ 1 & 1 & 0 & 0 \\ 0 & 1 & 1 & 0 \\ 0 & 0 & 1 & 1 \\ 1 & 1 & 0 & 1 \\ 1 & 0 & 1 & 0 \\ 0 & 1 & 0 & 1 \\ 1 & 1 & 1 & 0 \\ 0 & 1 & 1 & 1 \\ 1 & 1 & 1 & 1 \\ 1 & 0 & 1 & 1 \\ 1 & 0 & 0 & 1 \end{bmatrix} \qquad \text{Equation 13}$$

When the seed value s is (1, 3, 2, 4), "1", "3", "2", and "4" represent the indices of columns in Equation 13. The seed value changes the column order of the parity matrix from (1, 2, 3, 4) to (1, 3, 2, 4).

Assuming that an i-th column of the matrix in Equation 13 is $c_i$, $c_1$, $c_2$, $c_3$ and $c_4$ may be represented as follows: $c_1$=[0, 1, 0, 0, 1, 1, 0, 1, 0, 1, 1, 1]$^T$, $c_2$=[0, 1, 1, 0, 1, 0, 1, 1, 1, 1, 0, 0]$^T$, $c_3$=[0, 0, 1, 1, 0, 1, 0, 1, 1, 1, 1, 0]$^T$, and $c_3$=[1, 0, 0, 1, 1, 0, 1, 1, 1, 1, 1]$^T$.

> For j=1:
>> t=$c_1$, S=[ ] and u=0.
>> The following results: Φ={2, 5, 6, 8, 10, 11, 12} and c={2, 5, 6, 8, 10, 11, 12} may be obtained from Equations (1) and (2) of Table 1. Since Φ contains the indices of non-zero positions in a j-th column t of the parity matrix $P_{K*J}$, it may be seen that Φ={2, 5, 6, 8, 10, 11, 12} by considering the positions of "1" of $c_1$=[0, 1, 0, 0, 1, 1, 0, 1, 0, 1, 1, 1]$^T$. Since ε corresponds to a difference between Φ and S and S is initially an empty set, it may be seen that ε=Φ={2, 5, 6, 8, 10, 11, 12}.
>> Since the number of elements of ε={2, 5, 6, 8, 10, 11, 12} is 7, Int(u+k)=ε(k) may be determined as follows using Equation (3) of Table 1 for k=1 to 7.
    Int(0+1)=Int(1)=ε(1)=2,
    Int(0+2)=Int(2)=ε(2)=5,
    Int(0+3)=Int(3)=ε(3)=6,
    Int(0+4)=Int(4)=ε(4)=8,
    Int(0+5)=Int(5)=ε(5)=10,
    Int(0+6)=Int(6)=ε(6)=11,
    Int(0+7)=Int(7)=ε(7)=12.
>> The following result: Int(u+|ε|+1)=K+s(j), i.e., Int(0+7+1)=Int(8)=12+s(1) may be obtained from Equation (4) of Table 1. In this example, since the seed value s is (1, 3, 2, 4), s(1)=1. Thus, Int(8)=13.
> For j=2:
>> t=$c_3$, S={2, 5, 6, 8, 10, 11, 12} and u=8. For j=2, t denotes an s(2)-th column in Equation 13, i.e., the third column therein. Since S={ }, ε={2, 5, 6, 8, 10, 11, 12}, and u=0 for j=1, it may be seen from the equations below Equation (4) of Table 1 that the following relationships: S=S ∪ ε={ }∪{2, 5, 6, 8, 10, 11, 12}={2, 5, 6, 8, 10, 11, 12} and u=u+length(ε)+1=0+7+1=8 are satisfied for j=2.
>> The following results: Φ={3, 4, 6, 8, 9, 10, 11} and ε={3, 4, 9} may be obtained from equations (1) and (2) of Table 1. For j=2, Φ includes the position indices of "1" in $c_3$=[0, 0, 1, 1, 0, 1, 0, 1, 1, 1, 1, 0]$^T$. The result of ε={3, 4, 9} may be obtained by excluding the elements of S={2, 5, 6, 8, 10, 11, 12} from Φ={3, 4, 6, 8, 9, 10, 11}.
>> Since the number of elements of ε={3, 4, 9} is 3, Int(u+k)=ε(k) may be determined as follows using Equation (3) of Table 1 for k=1 to 3.

Int(8+1)=Int(9)=ε(1)=3,
Int(8+2)=Int(10)=ε(2)=4,
Int(8+3)=Int(11)=ε(3)=9.
>> The following result: Int(u+|ε|+1)=K+s(j), i.e., Int(8+3+1)=Int(12)=12+s(2) may be obtained from Equation (4) of Table 1. In this example, since the seed value s is (1, 3, 2, 4), s(2)=3. Thus, Int(12)=15.
> For j=3:
>> t=$c_2$, S={2, 3, 4, 5, 6, 8, 9, 10, 11, 12} and u=12. For j=3, t denotes an s(3)-th column in Equation 13, i.e., the second column therein. Since S={2, 5, 6, 8, 10, 11, 12}, ε={3, 4, 9}, and u=8 for j=2, it may be seen from the equations below Equation (4) of Table 1 that the following relationships: S=S ∪ ε={2, 5, 6, 8, 10, 11, 12} ∪ {3, 4, 9}={2, 3, 4, 5, 6, 8, 9, 10, 11, 12} and u=u+length(ε)+1=8+3+1=12 are satisfied for j=3.
>> The following results: Φ={2, 3, 5, 7, 8, 9, 10} and ε={7} may be obtained from Equations (1) and (2) of Table 1. For j=2, 1 includes the position indices of "1" in $c_2$=[0, 1, 1, 0, 1, 0, 1, 1, 1, 1, 0, 0]$^T$. The result of ε={7} may be obtained by excluding the elements of S={2, 3, 4, 5, 6, 8, 9, 10, 11, 12} from Φ={2, 3, 5, 7, 8, 9, 10}.
>> Since the number of elements of ε={7} is 1, Int(u+k)=ε(k) may be determined as follows using Equation (3) of Table 1 for k=1.
Int(12+1)=Int(13)=ε(1)=7.
>> The following result: Int(u+|ε|+1)=K+s(j), i.e., Int(12+1+1)=Int(14)=12+s(3) may be obtained from Equation (4) of Table 1. In this example, since the seed value s is (1, 3, 2, 4), s(3)=2. Thus, Int(14)=14.
> For j=4:
>> t=$c_4$, S={2, 3, 4, 5, 6, 7, 8, 9, 10, 11, 12}, and u=14. For j=4, t denotes an s(4)-th column in Equation 13, i.e., the fourth column therein. Since S={2, 3, 4, 5, 6, 8, 9, 10, 11, 12}, ε={7}, and u=12 for j=3, it may be seen from the equations below Equation (4) of Table 1 that the following relationships: S=S ∪ ε={2, 3, 4, 5, 6, 8, 9, 10, 11, 12} ∪ {7}={2, 3, 4, 5, 6, 7, 8, 9, 10, 11, 12} and u=u+length(ε)+1=12+1+1=14 are satisfied for j=4.
>> The following results: Φ={1, 4, 5, 7, 9, 10, 11, 12} and ε={1} may be obtained from Equations (1) and (2) of Table 1. For j=3, Φ includes the position indices of "1" in $c_2$=[0, 1, 1, 0, 1, 0, 1, 1, 1, 1, 0, 0]$^T$. The result of ε={1} may be obtained by excluding the elements of S={2, 3, 4, 5, 6, 7, 8, 9, 10, 11, 12} from Φ={1, 4, 5, 7, 9, 10, 11, 12}.
>> Since the number of elements of ε={2} is 1, Int(u+k)=ε(k) may be determined as follows using Equation (3) of Table 1 for k=1.
Int(14+1)=Int(15)=ε=1.
>> The following result: Int(u+|ε|ε|+1)=K+s(j), i.e., Int(14+1+1)=Int(16)=12+s(4) may be obtained from Equation (4) of Table 1. In this example, since the seed value s is (1, 3, 2, 4), s(4)=4. Thus, Int(16)=16.

An output sequence based on the algorithm of Table 1, i.e., a sequence obtained by arranging numerals from Int(1) to Int(15) is defined as follows: Int=(2, 5, 6, 8, 10, 11, 12, 13, 3, 4, 9, 15, 7, 14, 1, 16). In Int=(2, 5, 6, 8, 10, 11, 12, 13, 3, 4, 9, 15, 7, 14, 1, 16), indices greater than the number of information bits (K=12) represent the positions of parity bits in a bit sequence interleaved by the bit interleaver. For example, in the case of using Int=(2, 5, 6, 8, 10, 11, 12, 13, 3, 4, 9, 15, 7, 14, 1, 16), information bits and parity bits {$p_1p_2$, $p_3$,$p_4$} are interleaved by the bit interleaver as follows: {$i_2,i_5,i_6,i_8$, $i_{10},i_{11},i_{12},p_1,i_3,i_4,i_9,p_3,i_7,p_2,i_1,p_4$}. The interleaved bit sequence {$i_2,i_5,i_6,i_8$, $i_{10},i_{11},i_{12},p_1,i_3,i_4,i_9,p_3$, $i_7,p_2,i_1,p_4$} may be input to the polar encoder of FIG. 11. In this case, the early termination may be performed as follows during the CAL decoding process.

>1. The polar decoder decodes ($i_2,i_5,i_6,i_8$, $i_{10},i_{11},i_{12},p_1$) which is a part of the input bits of the polar code, and then performs CRC-CHECK therefor. If CRC-CHECK for all L candidate information bit sequences in ($i_2,i_5,i_6,i_8$, $i_{10},i_{11},i_{12}$, $p_1$) fails, the polar decoder declares an error and stops the decoding.

>2. If the polar decoder does not stop the decoding during CRC-CHECK for ($i_2,i_5,i_6,i_8$, $i_{10},i_{11},i_{12},p_1$), the polar decoder additionally decodes ($i_3,i_4,i_9,p_3$). Then, the decoder performs CRC-CHECK for ($i_2,i_5,i_6,i_8,i_{10},i_{11},i_{12},p_1,i_3,i_4,i_9,p_3$). If CRC-CHECK for all L candidate information bit sequences in ($i_2,i_5,i_6,i_8,i_{10},i_{11},i_{12},p_1,i_3,i_4,i_9,p_3$) fails, the polar decoder declares an error and stops the decoding.

>3. If the polar decoder does not stop the decoding while performing CRC-CHECK for ($i_2,i_5,i_6,i_8$, $i_{10},i_{11},i_{12},p_1$, $i_3,i_4$, $i_9,p_3$), the polar decoder additionally decodes ($i_7,p_2$). Then, the decoder performs CRC-CHECK for ($i_2,i_5,i_6,i_8,i_{10},i_{11},i_{12}$, $p_1,i_3,i_4,i_9,p_3,i_7,p_2$). If CRC-CHECK for all L candidate information bit sequences in ($i_2,i_5,i_6,i_8,i_{10},i_{11},i_{12},p_1,i_3,i_4,i_9$, $p_3,i_7,p_2$) fails, the polar decoder declares an error and stops the decoding.

>4. If the polar decoder does not stop the decoding while performing CRC-CHECK for ($i_2,i_5,i_6,i_8,i_{10},i_{11},i_{12},p_1,i_3,i_4,i_9$, $p_3,i_7,p_2$), the polar decoder additionally decodes ($i_1,p_4$). Then, the decoder performs CRC-CHECK for ($i_2,i_5,i_6,i_8,i_{10}$, $i_{11},i_{12},p_1,i_3,i_4,i_9,p_3,i_7,p_2$, $i_1,p_4$). If CRC-CHECK for all L candidate information bit sequences in ($i_2,i_5,i_6,i_8,i_{10},i_{11},i_{12}$, $p_1,i_3,i_4,i_9,p_3,i_7,p_2$) fails, the polar decoder declares an error and stops the decoding. The polar decoder determines a candidate that passes CRC-CHECK among L candidate information bit sequences in ($i_2,i_5,i_6,i_8,i_{10},i_{11},i_{12},p_1,i_3,i_4,i_9$, $p_3,i_7,p_2$, $i_1,p_4$) as a decoded information bit sequence. If CRC-CHECK for all the candidates fails, the polar decoder declares an error.

A generator polynomial used for generating a CRC code may be defined in each communication system. A unique generator matrix G may be obtained from a given generator polynomial, and thus a unique party matrix may also be determined based on the given generator polynomial. Even when a CRC generator polynomial different from the CRC generation polynomial of G=[$I_{12*12},P_{12*4}$] described in the above example is used, an interleaver pattern, i.e., a pattern of interleaved bit indices may be obtained by applying the above-described interleaver design principal (i.e., the algorithm of Table 1). When different CRC polynomials are used for uplink and downlink, different interleavers (i.e., different interleaving patterns) may be used for the same information size (i.e., the same number of information bits). Since interleaving is applied before information bits are input to the polar code, the same interleaver may be used even though the size of a mother polar code is changed for the same information size.

EXAMPLE 2

In Example 2, interleavers for various information bit lengths, which are designed based on the proposed algorithm, will be described. In Example 2, it is assumed that a 19-bit CRC code is used and the generator polynomial in Equation 14 below is used for the 19-bit CRC code.

$$x^{19}+x^{18}+x^{16}+x^{15}+x^{14}+x^{13}+x^{12}+x^{10}+x^9+x^7+x^5+x^3+x^2+x+1 \quad \text{Equation 14}$$

* K=5, J=19

For K=5 and J=19, the seed value s for generating the optimal interleaver pattern is as follows: s=(6, 7, 8, 4, 3, 10, 14, 16, 19, 18, 15, 11, 12, 1, 5, 2, 9, 13, 17), and the interleaver pattern Int obtained from the optimal seed value is as follows: Int=(5, 11, 4, 12, 13, 2, 3, 9, 1, 8, 15, 19, 21, 24, 23, 20, 16, 17, 6, 10, 7, 14, 18, 22).

* K=13, J=19

For K=13 and J=19, the seed value s for generating the optimal interleaver pattern is as follows: s=(5, 6, 9, 7, 19, 4, 11, 15, 18, 3, 17, 14, 1, 12, 16, 2, 13, 10, 8), and the interleaver pattern Int obtained from the optimal seed value is as follows: Int=(4, 7, 8, 11, 13, 18, 1, 3, 19, 6, 9, 22, 2, 12, 20, 32, 10, 17, 5, 24, 28, 31, 16, 30, 27, 14, 25, 29, 15, 26, 23, 21).

* K=45, J=19

For K=45 and J=19, the seed value s for generating the optimal interleaver pattern is as follows: s=(5, 8, 4, 15, 7, 19, 18, 16, 6, 14, 10, 12, 13, 9, 11, 2, 1, 3, 17), and the interleaver pattern Int obtained from the optimal seed value is as follows: Int=(6, 7, 8, 10, 11, 16, 18, 19, 20, 23, 26, 27, 28, 30, 32, 36, 39, 40, 43, 45, 50, 1, 4, 13, 14, 24, 34, 37, 44, 53, 2, 9, 29, 42, 49, 5, 12, 15, 17, 21, 22, 25, 33, 38, 41, 60, 3, 35, 52, 31, 64, 63, 61, 51, 59, 55, 57, 58, 54, 56, 47, 46, 48, 62).

As another method, in the case of non-distributed CRC bits, since the early termination of decoding guarantees no gain in spite of interleaving, the corresponding CRC bits may be arranged within an interleaving pattern in the order of bit indices. For example, Int=(6, 7, 8, 10, 11, 16, 18, 19, 20, 23, 26, 27, 28, 30, 32, 36, 39, 40, 43, 45, 50, 1, 4, 13, 14, 24, 34, 37, 44, 53, 2, 9, 29, 42, 49, 5, 12, 15, 17, 21, 22, 25, 33, 38, 41, 60, 3, 35, 52, 31, 64, 63, 61, 51, 59, 55, 57, 58, 54, 56, 47, 46, 48, 62), since indices of (64, 63, 61, 51, 59, 55, 57, 58, 54, 56, 47, 46, 48, 62), which are greater than 45, are consecutively arranged, there is no effect on the early termination gain even if the indices are arranged in the index order. Accordingly, Int=(6, 7, 8, 10, 11, 16, 18, 19, 20, 23, 26, 27, 28, 30, 32, 36, 39, 40, 43, 45, 50, 1, 4, 13, 14, 24, 34, 37, 44, 53, 2, 9, 29, 42, 49, 5, 12, 15, 17, 21, 22, 25, 33, 38, 41, 60, 3, 35, 52, 31, 46, 47, 48, 51, 54, 55, 56, 57, 58, 59, 61, 62, 63, 64) and Int=(6, 7, 8, 10, 11, 16, 18, 19, 20, 23, 26, 27, 28, 30, 32, 36, 39, 40, 43, 45, 50, 1, 4, 13, 14, 24, 34, 37, 44, 53, 2, 9, 29, 42, 49, 5, 12, 15, 17, 21, 22, 25, 33, 38, 41, 60, 3, 35, 52, 31, 64, 63, 61, 51, 59, 55, 57, 58, 54, 56, 47, 46, 48, 62) may have the same performance in terms of the early termination of decoding. In the present disclosure, interleaving patterns obtained by changing the order of consecutive CRC bit indices in an interleaver pattern generated by a specific optimal seed value may have the same performance regarding the early termination of decoding. In the present disclosure, when there are consecutive CRC bit indices in an interleaver pattern obtained based on a specific optimal seed value and a specific CRC generator matrix, an interleaver pattern obtained by changing the consecutive CRC bit indices may also be used as the interleaver pattern based on the specific seed value.

* K=109, J=19

For K=109 and J=19, the seed value s for generating the optimal interleaver pattern is as follows: s=(11, 10, 1, 12, 13, 17, 19, 2, 6, 4, 14, 16, 5, 3, 15, 8, 18, 7, 9), and the interleaver pattern Int obtained from the optimal seed value is as follows: Int=(1, 2, 4, 5, 8, 11, 12, 14, 16, 17, 20, 22, 24, 26, 27, 28, 31, 32, 34, 41, 48, 49, 53, 54, 57, 61, 62, 65, 67, 69, 71, 80, 82, 85, 86, 88, 89, 90, 91, 93, 95, 96, 101, 102, 103, 105, 107, 108, 120, 3, 6, 15, 19, 29, 30, 35, 44, 47, 51, 52, 55, 56, 72, 74, 75, 77, 78, 87, 94, 98, 99, 106, 109, 119, 7, 9, 25, 33, 36, 42, 45, 50, 63, 70, 73, 76, 79, 92, 100, 110, 13, 18, 21, 23, 58, 66, 68, 81, 83, 97, 104, 121, 10, 43, 59, 64, 84, 122, 38, 46, 126, 40, 60, 128, 37, 111, 39, 115, 113, 123, 125, 114, 112, 124, 117, 127, 116, 118).

As a further method, in the case of non-distributed CRC bits, since the early termination of decoding guarantees no gain in spite of interleaving, the corresponding CRC bits may be arranged within an interleaving pattern in the order of bit indices. For example, for K=109 and J=19, the following interleaver pattern: Int=(1, 2, 4, 5, 8, 11, 12, 14, 16, 17, 20, 22, 24, 26, 27, 28, 31, 32, 34, 41, 48, 49, 53, 54, 57, 61, 62, 65, 67, 69, 71, 80, 82, 85, 86, 88, 89, 90, 91, 93, 95, 96, 101, 102, 103, 105, 107, 108, 120, 3, 6, 15, 19, 29, 30, 35, 44, 47, 51, 52, 55, 56, 72, 74, 75, 77, 78, 87, 94, 98, 99, 106, 109, 119, 7, 9, 25, 33, 36, 42, 45, 50, 63, 70, 73, 76, 79, 92, 100, 110, 13, 18, 21, 23, 58, 66, 68, 81, 83, 97, 104, 121, 10, 43, 59, 64, 84, 122, 38, 46, 126, 40, 60, 128, 37, 111, 39, 112, 113, 114, 115, 116, 117, 118, 123, 124, 125, 127) may be used. Further, in Int=(1, 2, 4, 5, 8, 11, 12, 14, 16, 17, 20, 22, 24, 26, 27, 28, 31, 32, 34, 41, 48, 49, 53, 54, 57, 61, 62, 65, 67, 69, 71, 80, 82, 85, 86, 88, 89, 90, 91, 93, 95, 96, 101, 102, 103, 105, 107, 108, 120, 3, 6, 15, 19, 29, 30, 35, 44, 47, 51, 52, 55, 56, 72, 74, 75, 77, 78, 87, 94, 98, 99, 106, 109, 119, 7, 9, 25, 33, 36, 42, 45, 50, 63, 70, 73, 76, 79, 92, 100, 110, 13, 18, 21, 23, 58, 66, 68, 81, 83, 97, 104, 121, 10, 43, 59, 64, 84, 122, 38, 46, 126, 40, 60, 128, 37, 111, 39, 115, 113, 123, 125, 114, 112, 124, 117, 127, 116, 118), interleaver patterns obtained by changing the positions of consecutive CRC bit indices of (112, 113, 114, 115, 116, 117, 118, 123, 124, 125, 127) may be used for K=109 and J=19.

* K=173, J=19

For K=173 and J=19, the optimal interleaver pattern Int is as follows: Int=(2, 6, 8, 14, 16, 17, 18, 20, 21, 22, 23, 24, 25, 33, 39, 43, 44, 45, 46, 48, 49, 52, 54, 55, 59, 63, 64, 72, 75, 76, 78, 79, 81, 87, 88, 89, 92, 95, 96, 98, 100, 101, 102, 106, 108, 110, 111, 114, 116, 117, 118, 121, 122, 126, 127, 128, 129, 130, 131, 132, 133, 134, 139, 140, 142, 143, 146, 147, 148, 150, 151, 152, 153, 154, 159, 161, 162, 164, 167, 168, 169, 170, 171, 173, 176, 3, 9, 11, 13, 26, 27, 28, 32, 34, 35, 37, 56, 58, 66, 67, 71, 73, 82, 84, 86, 91, 94, 97, 99, 103, 104, 119, 124, 144, 145, 160, 163, 179, 5, 19, 36, 42, 47, 51, 57, 62, 90, 105, 109, 113, 120, 125, 135, 136, 137, 149, 155, 156, 157, 165, 172, 174, 4, 7, 10, 15, 38, 41, 50, 53, 61, 65, 83, 107, 112, 115, 123, 138, 158, 178, 29, 30, 60, 68, 69, 74, 93, 141, 181, 12, 31, 70, 77, 85, 166, 192, 1, 40, 80, 175, 177, 180, 181, 182, 183, 184, 185, 186, 187, 188, 189, 190, 191).

*K=237, J=19

For K=237 and J=19, the optimal interleaver pattern Int is as follows: Int=(4, 5, 6, 7, 8, 13, 16, 18, 20, 21, 22, 24, 29, 30, 32, 41, 42, 43, 45, 46, 47, 50, 51, 53, 55, 57, 59, 60, 62, 63, 64, 67, 72, 73, 75, 77, 82, 85, 86, 87, 90, 91, 92, 96, 98, 99, 101, 103, 107, 109, 116, 119, 120, 122, 123, 127, 128, 130, 131, 135, 137, 139, 142, 143, 146, 148, 150, 151, 155, 158, 160, 161, 162, 163, 166, 167, 168, 172, 174, 178, 182, 183, 186, 188, 190, 192, 193, 195, 197, 198, 206, 207, 208, 209, 210, 211, 212, 215, 216, 217, 218, 223, 224, 225, 227, 228, 231, 232, 237, 243, 2, 19, 23, 25, 26, 27, 31, 34, 36, 39, 49, 52, 61, 66, 70, 78, 80, 81, 84, 88, 89, 97, 108, 110, 112, 113, 118, 136, 140, 145, 152, 153, 156, 159, 164, 165, 170, 175, 180, 181, 185, 191, 194, 196, 203, 204, 214, 226, 233, 234, 235, 240, 3, 11, 15, 37, 48, 65, 71, 74, 79, 95, 102, 104, 105, 117, 124, 126, 129, 132, 133, 144, 154, 169, 176, 177, 189, 199, 213, 219, 221, 229, 230, 236, 248, 9, 10, 17, 28, 35, 40, 44, 54, 68, 69, 76, 100, 114, 115, 125, 134, 138, 141, 149, 157, 179, 200, 202, 205, 220, 256, 33, 56, 58, 93, 94, 106, 171, 201, 246, 38, 121, 184, 252, 1, 12, 14, 111, 222, 249, 83, 147, 251, 173, 245, 238, 247, 239, 187, 241, 242, 244, 246, 250, 253, 254, 255).

EXAMPLE 3

In Example 3, optimal seed values having good performance in the early termination for various information bit lengths will be described. Assuming that a 19-bit CRC code is used as in Example 2, and more particularly, assuming that the bit length of a CRC code is 19 and the CRC generator polynomial of Equation 14 is used, the following seed values may be used to interleave the following bit sequences, each of which consists of information bit sequence+CRC code, based on the sum K' of the number of information bits K and the number of CRC bits J.

TABLE 2

| The number (K') of information + CRC bits | Seed vector (s) |
|---|---|
| K' = 32 | s = (5, 6, 9, 7, 19, 4, 11, 15, 18, 3, 17, 14, 1, 12, 16, 2, 13, 10, 8) |
| 32 < K' = 64 | s = (5, 8, 4, 15, 7, 19, 18, 16, 6, 14, 10, 12, 13, 9, 11, 2, 1, 3, 17) |
| 64 < K' = 96 | s = (10, 11, 16, 18, 1, 7, 9, 2, 15, 4, 17, 8, 12, 14, 19, 5, 3, 13, 6) |
| 96 < K' = 128 | s = (11, 10, 1, 12, 13, 17, 19, 2, 6, 4, 14, 16, 5, 3, 15, 8, 18, 7, 9) |
| 128 < K' = 160 | s = (3, 6, 12, 8, 17, 16, 11, 14, 19, 7, 9, 13, 4, 18, 2, 1, 10, 15, 5) |
| 160 < K' = 192 | s = (3, 6, 1, 5, 8, 19, 10, 2, 15, 4, 12, 11, 9, 17, 16, 13, 14, 7, 18) |
| 192 < K' = 224 | s = (11, 1, 8, 5, 18, 14, 7, 19, 3, 12, 16, 17, 6, 13, 10, 9, 2, 4, 15) |
| 224 < K' | s = (6, 3, 11, 19, 9, 15, 12, 14, 8, 1, 10, 2, 17, 7, 13, 5, 18, 4, 16) |

In Table 2, an interleaving pattern for K'=32, i.e., K=13 may be equal to the interleaving pattern for K=13 and J=19 described in Example 2. An interleaving pattern for K'=64, i.e., K=45 may be equal to the interleaving pattern for K=54 and J=19 described in Example 2. An interleaving pattern for K'=128, i.e., K=109 may be equal to the interleaving pattern for K=109 and J=19 described in Example 2. An interleaving pattern for K'=192, i.e., K=173 may be equal to the interleaving pattern for K=173 and J=19 described in Example 2.

EXAMPLE 4

In Example 4, the granularity of K' is set to 64 for optimal seed values having good performance in the early termination, in contrast to Table 2 in Example 3 which shows seed vectors by setting the granularity of K' to 32 for various information bit lengths. Assuming that a 19-bit CRC code is used as in Example 2, and more particularly, assuming that the bit length of a CRC code is 19 and the CRC generator polynomial of Equation 14 is used, the following seed values may be used to interleave the following bit sequences, each of which consists of information bit sequence+CRC code, based on the sum K' of the number of information bits K and the number of CRC bits J.

TABLE 3

| The number (K') of information + CRC bits | Seed vector (s) |
|---|---|
| K' = 64 | s = (5, 8, 4, 15, 7, 19, 18, 16, 6, 14, 10, 12, 13, 9, 11, 2, 1, 3, 17) |

TABLE 3-continued

| The number (K') of information + CRC bits | Seed vector (s) |
|---|---|
| 64 < K' = 128 | s = (11, 10, 1, 12, 13, 17, 19, 2, 6, 4, 14, 16, 5, 3, 15, 8, 18, 7, 9) |
| 128 < K' = 192 | s = (3, 6, 1, 5, 8, 19, 10, 2, 15, 4, 12, 11, 9, 17, 16, 13, 14, 7, 18) |
| 192 < K' = 256 | s = (6, 3, 11, 19, 9, 15, 12, 14, 8, 1, 10, 2, 17, 7, 13, 5, 18, 4, 16) |
| 256 < K' = 320 | s = (3, 6, 11, 13, 2, 8, 18, 4, 1, 12, 5, 7, 14, 17, 10, 15, 16, 19, 9) |
| 320 < K' = 384 | s = (6, 3, 11, 5, 1, 8, 2, 9, 17, 19, 15, 13, 14, 12, 18, 4, 10, 16, 7) |
| 384 < K' = 448 | s = (6, 3, 18, 2, 1, 16, 10, 19, 8, 17, 9, 13, 5, 7, 4, 12, 14, 11, 15) |
| 448 < K' = 512 | s = (3, 6, 11, 2, 5, 12, 16, 8, 10, 1, 13, 17, 9, 19, 18, 7, 14, 15, 4) |
| 512 < K' = 576 | s = (6, 11, 9, 7, 10, 13, 16, 2, 8, 15, 4, 1, 3, 17, 19, 12, 5, 14, 18) |
| 576 < K' = 640 | s = (1, 2, 19, 8, 18, 16, 17, 13, 4, 12, 3, 7, 9, 6, 10, 5, 15, 11, 14) |
| 640 < K' = 704 | s = (19, 1, 18, 15, 16, 17, 6, 11, 2, 12, 9, 5, 7, 13, 4, 14, 10, 8, 3) |
| 704 < K' = 768 | s = (2, 1, 3, 12, 5, 4, 18, 15, 7, 16, 14, 13, 17, 8, 6, 19, 10, 9, 11) |
| 768 < K' | s = (1, 6, 9, 12, 13, 8, 10, 19, 14, 4, 16, 5, 3, 2, 15, 7, 11, 17, 18) |

In Table 3, an interleaving pattern for K'=64, i.e., K=45 may be equal to the interleaving pattern for K=54 and J=19 described in Example 2. An interleaving pattern for K'=128, i.e., K=109 may be equal to the interleaving pattern for K=109 and J=19 described in Example 2. An interleaving pattern for K'=192, i.e., K=173 may be equal to the interleaving pattern for K=173 and J=19 described in Example 2. An interleaving pattern for K'=256, i.e., K=257 may be equal to the interleaving pattern for K=237 and J=19 described in Example 2.

In Examples 3 and 4, K' denotes a bit length including the number of CRC bits, that is, the sum of the information bit size and the CRC bit size. For a specific seed value (or seed vector) and a specific CRC generator polynomial, a unique interleaving (or interleaver) pattern is determined based on the number of information bits and the number of CRC bits. Thus, a seed value in Table 2 of Example 3 or Table 3 of Example 4 may represent an interleaver pattern for each value of K' based on the 19-bit CRC code and the CRC generator polynomial of Equation 14. In particular, Table 2 of Example 3 and Table 3 of Example 4 shows interleaving patterns for the individual ranges of multiple K' values. For example, referring to Table 3, when K'=50, an encoder and decoder according to the present disclosure may modify and use an interleaving pattern when K'=64. When K'=$K_{max}$−k (where $K_{max}$ is the maximum value among K' values in a range to which K' belongs), if idx($K_{max}$) represents index values of an interleaving pattern for $K_{max}$, index values of an interleaving pattern for K' may be obtained by selecting values greater than 0 among values of idx($K_{max}$)−1. In other words, when K'=$K_{max}$−k, the indices of the interleaving pattern for K' may be obtained by selecting values greater than 0 among values obtained by subtracting k from each of the indices of the interleaving pattern for $K_{max}$. For example, when $K_{max}$=6 and the indices of a corresponding interleaver pattern are {1, 3, 2, 5, 4, 6}, an interleaver pattern for K'=4 is {1, 3, 2, 4}, which is obtained by selecting values greater than 0 among {4, 1, 0, 3, 2, 4}. Alternatively, an interleaver pattern composed of the following values may be used as the interleaver pattern for K'. First, index values are obtained by excluding index values greater than K' from the reverse values ($K_{max}$−idx($K_{max}$)+1) of the index values of the interleaver pattern for $K_{max}$, and then the obtained index values are reversed again with respect to K' again (=K'−idx(K')+1). Using these values, the above interleaver pattern is configured. For example, when $K_{max}$=6 and the indices of a corresponding interleaver pattern is {1, 3, 2, 5, 4, 6}, an interleaver pattern for K'=4 is {1, 3, 2, 4}. The interleaver pattern for K'=4 is obtained as follows. Indices of {6, 4, 5, 2, 3, 1} are obtained by reversing the interleaver pattern for $K_{max}$=6, {1, 3, 2, 5, 4, 6}, indices of {4, 2, 3, 1} are obtained by discarding indices greater than K'=4, and then the interleaver pattern for K'=4, {1, 3, 2, 4} is obtained by reversing each of the indices of {4, 2, 3, 1} with respect to 4.

According to the present disclosure, the number of distributed CRC bits may vary depending on the granularity of K' (the granularity is set to 32 in Table 2 and 64 in Table 3). For example, for the same value of K', seed vectors when the granularity of K' is 32 may be different from those when the granularity of K' is 54 as shown in Tables 2 and 3. In addition, according to the present disclosure, even if the granularity of K' is the same, the number of distributed CRC bits may vary depending on mother code sizes, coding rates, or K' values. For example, in Tables 2 and 3, a seed vector to be used may be determined for each range of K' or for each value of K'.

Figure 12:
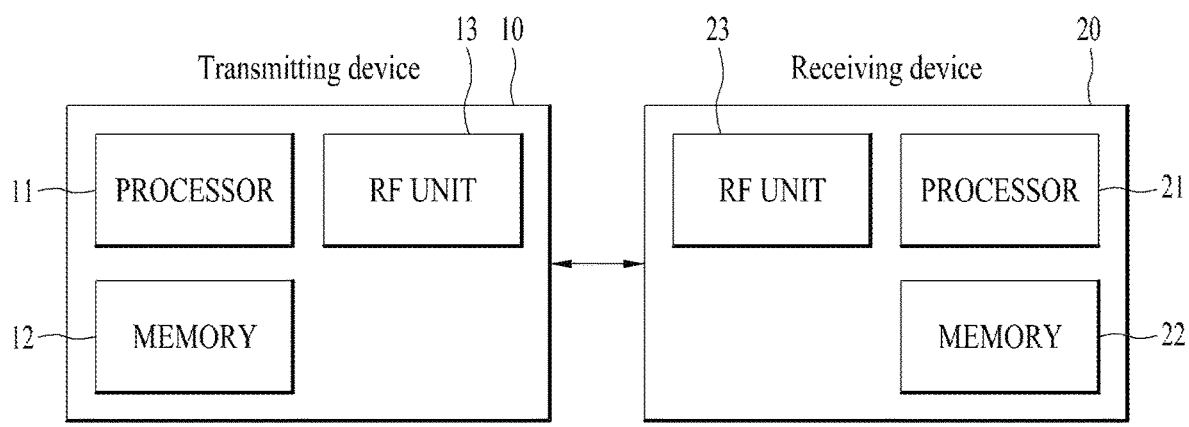
FIG. 12 is a block diagram illustrating elements of a transmitting device 10 and a receiving device 20 for implementing the present disclosure.

FIG. 12 is a block diagram illustrating elements of a transmitting device 10 and a receiving device 20 for implementing the present disclosure.

The transmitting device 10 and the receiving device 20 respectively include radio frequency (RF) units 13 and 23 capable of transmitting and receiving radio signals carrying information, data, signals, and/or messages, memories 12 and 22 for storing information related to communication in a wireless communication system, and processors 11 and 21 operationally connected to elements such as the RF units 13 and 23 and the memories 12 and 22 to control the elements and configured to control the memories 12 and 22 and/or the RF units 13 and 23 so that a corresponding device may perform at least one of the above-described examples of the present disclosure.

The memories 12 and 22 may store programs for processing and controlling the processors 11 and 21 and may temporarily store input/output information. The memories 12 and 22 may be used as buffers.

The processors 11 and 21 generally control the overall operation of various modules in the transmitting device and the receiving device. Especially, the processors 11 and 21 may perform various control functions to implement the present disclosure. The processors 11 and 21 may be referred to as controllers, microcontrollers, microprocessors, or microcomputers. The processors 11 and 21 may be implemented by hardware, firmware, software, or a combination thereof. In a hardware configuration, application specific integrated circuits (ASICs), digital signal processors (DSPs), digital signal processing devices (DSPDs), programmable logic devices (PLDs), or field programmable gate arrays (FPGAs) may be included in the processors 11 and 21. Meanwhile, if the present disclosure is implemented using firmware or software, the firmware or software may be configured to include modules, procedures, functions, etc. performing the functions or operations of the present disclosure. Firmware or software configured to perform the present disclosure may be included in the processors 11 and 21 or stored in the memories 12 and 22 so as to be driven by the processors 11 and 21.

The processor 11 of the transmitting device 10 performs predetermined coding and modulation for a signal and/or data scheduled to be transmitted to the outside by the processor 11 or a scheduler connected with the processor 11, and then transfers the coded and modulated data to the RF unit 13. For example, the processor 11 converts a data stream to be transmitted into K layers through demultiplexing, channel coding, scrambling, and modulation. The coded data stream is also referred to as a codeword and is equivalent to a transport block which is a data block provided by a MAC layer. One transport block (TB) is coded into one codeword and each codeword is transmitted to the receiving device in the form of one or more layers. For frequency up-conversion, the RF unit 13 may include an oscillator. The RF unit 13 may include $N_t$ (where $N_t$ is a positive integer) transmit antennas.

A signal processing process of the receiving device 20 is the reverse of the signal processing process of the transmitting device 10. Under control of the processor 21, the RF unit 23 of the receiving device 20 receives radio signals transmitted by the transmitting device 10. The RF unit 23 may include $N_r$ (where $N_r$ is a positive integer) receive antennas and frequency down-converts each signal received through receive antennas into a baseband signal. The processor 21 decodes and demodulates the radio signals received through the receive antennas and restores data that the transmitting device 10 intended to transmit.

The RF units 13 and 23 include one or more antennas. An antenna performs a function for transmitting signals processed by the RF units 13 and 23 to the exterior or receiving radio signals from the exterior to transfer the radio signals to the RF units 13 and 23. The antenna may also be called an antenna port. Each antenna may correspond to one physical antenna or may be configured by a combination of more than one physical antenna element. The signal transmitted from each antenna cannot be further deconstructed by the receiving device 20. An RS transmitted through a corresponding antenna defines an antenna from the view point of the receiving device 20 and enables the receiving device 20 to derive channel estimation for the antenna, irrespective of whether the channel represents a single radio channel from one physical antenna or a composite channel from a plurality of physical antenna elements including the antenna. That is, an antenna is defined such that a channel carrying a symbol of the antenna can be obtained from a channel carrying another symbol of the same antenna. An RF unit supporting a MIMO function of transmitting and receiving data using a plurality of antennas may be connected to two or more antennas.

The transmitting device 10 may include an interleaver and a polar encoder according to the present disclosure, and the receiving device 20 may include an interleaving pattern and a polar decoder according to the present disclosure. For example, the processor 11 of the transmitting device 10 may be configured to interleave a CRC-encoded bit sequence consisting of information bits and distributed CRC bits using the interleaving pattern according to the present disclosure. The processor 11 of the transmitting device 10 may be configured to perform polar encoding of the interleaved bit sequence. The processor 11 of the transmitting device 10 may be configured to control the transceiver 13 to transmit bits encoded using a polar code. The processor 21 of the receiving device 20 may be configured to control the transceiver 23 of the receiving device 20 to receive a radio signal containing encoded bits from the transmitting device 10. The processor 21 of the receiving device 20 may be configured to perform polar decoding of the receiving signal. For example, the processor 21 of the receiving device 20 may be configured to decode an information bit(s) and distributed CRC bits concatenated with the information bit(s) and perform CRC-CHECK therefor, using the interleaving pattern according to the present disclosure. The interleaver and polar encoder based on the interleaving pattern according to the present disclosure may be implemented as a part of the processor 11 of the transmitting device 10, and the polar decoder according to the present disclosure may be implemented as a part of the processor 21 of the receiving device 20. The processor 11 of the transmitting device 10 may be configured to control the interleaver, the polar encoder, and a CRC encoder configured to perform CRC encoding. The processor 21 of the receiving device 20 may be configured to control the polar decoder and a CRC decoder according to the interleaving pattern used by the transmitting device 10 or the interleaving pattern corresponding to the interleaver.

As described above, the detailed description of the preferred implementation examples of the present disclosure has been given to enable those skilled in the art to implement and practice the disclosure. Although the disclosure has been described with reference to exemplary examples, those skilled in the art will appreciate that various modifications and variations can be made in the present disclosure without departing from the spirit or scope of the disclosure described in the appended claims. Accordingly, the disclosure should not be limited to the specific examples described herein, but should be accorded the broadest scope consistent with the principles and novel features disclosed herein.

Examples of the present disclosure may be used for a processing chip connected to or mounted in a BS, a UE, or a communication device in a wireless communication system, or for other equipment.

What is claimed is:

1. A method of transmitting information by a transmitting device in a wireless communication system, the method comprising:
   generating, via a cyclic redundancy check (CRC) encoder of the transmitting device, K+J bits by adding J CRC bits to K information bits;
   interleaving, via an interleaver of the transmitting device, the K+J bits according to an interleaving pattern based on a seed value for permuting the J CRC bits;
   encoding, via a polar encoder, the interleaved bits based on a polar code; and
   transmitting, via at least one transceiver of the transmitting device, the encoded bits to a receiving device,
   wherein the seed value is predetermined based on K.

2. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for generation of the J CRC bits, a seed value for K+J=64 is s=(5, 8, 4, 15, 7, 19, 18, 16, 6, 14, 10, 12, 13, 9, 11, 2, 1, 3, 17).

3. The method of claim 2, wherein an interleaving pattern for K+J=64 is Int=(6, 7, 8, 10, 11, 16, 18, 19, 20, 23, 26, 27, 28, 30, 32, 36, 39, 40, 43, 45, 50, 1, 4, 13, 14, 24, 34, 37, 44, 53, 2, 9, 29, 42, 49, 5, 12, 15, 17, 21, 22, 25, 33, 38, 41, 60, 3, 35, 52, 31, 64, 63, 61, 51, 59, 55, 57, 58, 54, 56, 47, 46, 48, 62).

4. The method of claim 3, wherein an interleaving pattern for K+J=K' smaller than 64 includes values greater than 0 among values obtained by subtracting 64-K from each element of the interleaving pattern for K+J=64.

5. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for generation of the J CRC bits, a seed value for K+J=128 is s=(11, 10, 1, 12, 13, 17, 19, 2, 6, 4, 14, 16, 5, 3, 15, 8, 18, 7, 9).

6. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for generation of the J CRC bits, a seed value for K+J=192 is s=(3, 6, 1, 5, 8, 19, 10, 2, 15, 4, 12, 11, 9, 17, 16, 13, 14, 7, 18).

7. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for the J CRC bits, a seed value for K+J=256 is s=(6, 3, 11, 19, 9, 15, 12, 14, 8, 1, 10, 2, 17, 7, 13, 5, 18, 4, 16).

8. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for the J CRC bits, a seed value for K+J=320 is s=(3, 6, 11, 13, 2, 8, 18, 4, 1, 12, 5, 7, 14, 17, 10, 15, 16, 19, 9).

9. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for the J CRC bits, a seed value for K+J=384 is s=(6, 3, 11, 5, 1, 8, 2, 9, 17, 19, 15, 13, 14, 12, 18, 4, 10, 16, 7).

10. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for the J CRC bits, a seed value for K+J=448 is s=(6, 3, 18, 2, 1, 16, 10, 19, 8, 17, 9, 13, 5, 7, 4, 12, 14, 11, 15).

11. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for the J CRC bits, a seed value for K+J=512 is s=(3, 6, 11, 2, 5, 12, 16, 8, 10, 1, 13, 17, 9, 19, 18, 7, 14, 15, 4).

12. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for the J CRC bits, a seed value for K+J=576 is s=(6, 11, 9, 7, 10, 13, 16, 2, 8, 15, 4, 1, 3, 17, 19, 12, 5, 14, 18).

13. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for the J CRC bits, a seed value for K+J=640 is s=(1, 2, 19, 8, 18, 16, 17, 13, 4, 12, 3, 7, 9, 6, 10, 5, 15, 11, 14).

14. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for the J CRC bits, a seed value for K+J=704 is s=(19, 1, 18, 15, 16, 17, 6, 11, 2, 12, 9, 5, 7, 13, 4, 14, 10, 8, 3).

15. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for the J CRC bits, a seed value for K+J=768 is s=(2, 1, 3, 12, 5, 4, 18, 15, 7, 16, 14, 13, 17, 8, 6, 19, 10, 9, 11).

16. The method of claim 1, wherein, based on J=19 and a CRC generator polynomial of $x^{19}+x^{18}+x^{16}+x^{15}+x^{14}+x^{12}+x^{10}+x^9+x^7+x^5+x^3+x^2+x+1$ for the J CRC bits, a seed value for K+J>768 is s=(1, 6, 9, 12, 13, 8, 10, 19, 14, 4, 16, 5, 3, 2, 15, 7, 11, 17, 18).

17. A transmitting device for transmitting information in a wireless communication system, the transmitting device comprising:
   at least one transceiver;
   at least one processor;
   at least one memory storing at least one program that cause the at least one processor to perform operations comprising:
   generating, via a cyclic redundancy check (CRC) encoder, K+J bits by adding J CRC bits to K information bits;

interleaving, via an interleaver, the K+J bits according to an interleaving pattern based on a seed value for permuting the J CRC bits;

encoding, via a polar encoder, the interleaved bits based on a polar code; and transmitting, via the at least one transceiver, the encoded bits to a receiving device, wherein the seed value is predetermined based on K.

18. A method of receiving information by a receiving device in a wireless communication system, the method comprising:

receiving, via at least one transceiver of the receiving device from a transmitting device, K+J bits encoded based on a polar code, wherein K is a number of information bits and J is a number of cyclic redundancy check (CRC) bits; and decoding, via a polar decoder of the receiving device, the K+J bits based on the polar code according to an interleaving pattern, wherein the interleaving pattern is based on a seed value for permuting the J CRC bits, and wherein the seed value is predetermined based on K.

19. A receiving device for receiving information in a wireless communication system, the receiving device comprising:

at least one transceiver;

at least one processor;

at least one memory storing at least one program that cause the at least one processor to perform operations comprising:

receiving, via the at least one transceiver from a transmitting device, K+J bits encoded based on a polar code, wherein K is a number of information bits and J is a number of cyclic redundancy check (CRC) bits; and decoding, via a polar decoder, the K+J bits based on the polar code according to an interleaving pattern, wherein the interleaving pattern is based on a seed value for permuting the J CRC bits, and wherein the seed value is predetermined based on K.

* * * * *